(12) United States Patent
Park

(10) Patent No.: US 9,478,302 B2
(45) Date of Patent: Oct. 25, 2016

(54) NONVOLATILE MEMORY DEVICE AND METHOD FOR SENSING THE SAME

(71) Applicant: SAMSUNG ELECTRONICS CO., LTD., Suwon-Si, Gyeonggi-Do (KR)

(72) Inventor: Mu-Hui Park, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/687,409

(22) Filed: Apr. 15, 2015

(65) Prior Publication Data

US 2016/0035432 A1    Feb. 4, 2016

(30) Foreign Application Priority Data

Aug. 1, 2014  (KR) .................. 10-2014-0099083

(51) Int. Cl.
| | | |
|---|---|---|
| *G11C 7/00* | (2006.01) | |
| *G11C 16/28* | (2006.01) | |
| *G11C 7/06* | (2006.01) | |
| *G11C 11/16* | (2006.01) | |
| *G11C 11/56* | (2006.01) | |
| *G11C 13/00* | (2006.01) | |
| *G11C 11/22* | (2006.01) | |

(52) U.S. Cl.
CPC .............. *G11C 16/28* (2013.01); *G11C 7/065* (2013.01); *G11C 11/1657* (2013.01); *G11C 11/1673* (2013.01); *G11C 11/2273* (2013.01); *G11C 11/5678* (2013.01); *G11C 13/0002* (2013.01); *G11C 13/004* (2013.01); *G11C 13/0004* (2013.01); *G11C 13/0028* (2013.01); *G11C 2013/0054* (2013.01); *G11C 2213/71* (2013.01)

(58) Field of Classification Search
CPC ...... G11C 5/025; G11C 7/18; G11C 11/4097
USPC .................. 365/72, 148, 158, 203, 206, 207
See application file for complete search history.

(56) References Cited

U.S. PATENT DOCUMENTS

| | | | |
|---|---|---|---|
| 5,292,678 | A | 3/1994 | Dhong et al. |
| 6,538,476 | B2 | 3/2003 | Forbes |
| 6,574,129 | B1 | 6/2003 | Tran |

(Continued)

FOREIGN PATENT DOCUMENTS

| | | |
|---|---|---|
| JP | 09198886 | 7/1997 |
| JP | 2007141393 | 6/2007 |

(Continued)

OTHER PUBLICATIONS

Lee, Kwang-Jin et al., "A 90 nm 1.8 V 512 Mb Diode-Switch PRAM With 266 MB/s Read Throughput," IEEEJournal of Solid-State Circuits, vol. 43, No. 1, Jan. 2008.

*Primary Examiner* — Son Dinh
(74) *Attorney, Agent, or Firm* — Volentine & Whitt, PLLC

(57) ABSTRACT

A nonvolatile memory device includes a first resistive memory cell connected to a first word line, a second resistive memory cell connected to a second word line that is different from the first word line, a clamping unit connected between a sensing node and the first resistive memory cell to provide a clamping bias to the first resistive memory cell, a reference current supplying unit connected to the second resistive memory cell to supply a reference current, and a sense amplifier connected to the sensing node to sense a level change of the sensing node, wherein when the first word line is enabled, the second word line is disabled.

14 Claims, 29 Drawing Sheets

(56) References Cited

U.S. PATENT DOCUMENTS

| | | |
|---|---|---|
| 6,678,198 B2 | 1/2004 | Issa et al. |
| 7,251,178 B2 * | 7/2007 | Gogl .................. G11C 7/02 327/53 |
| 7,379,333 B2 | 5/2008 | Lee et al. |
| 7,457,151 B2 | 11/2008 | Cho et al. |
| 7,468,914 B2 | 12/2008 | Toda |
| 7,509,588 B2 | 3/2009 | Van Os et al. |
| 7,633,100 B2 | 12/2009 | Cho et al. |
| 7,636,264 B2 | 12/2009 | Fort |
| 7,729,189 B2 | 6/2010 | Forbes |
| 7,920,407 B2 | 4/2011 | Chen et al. |
| 8,130,578 B2 | 3/2012 | Won |
| 8,488,357 B2 | 7/2013 | Sunaga et al. |
| 8,498,141 B2 | 7/2013 | Sasaki et al. |
| 8,611,132 B2 | 12/2013 | Jung et al. |
| 2003/0169625 A1 * | 9/2003 | Hush .................. G11C 13/0011 365/189.07 |
| 2006/0062042 A1 * | 3/2006 | Karlsson .................. G11C 11/22 365/145 |
| 2006/0120172 A1 | 6/2006 | Lee et al. |
| 2007/0121376 A1 | 5/2007 | Toda |
| 2007/0157089 A1 | 7/2007 | Yan Os et al. |
| 2008/0094909 A1 | 4/2008 | Gallo et al. |
| 2008/0101110 A1 * | 5/2008 | Happ .................. G11C 11/5678 365/163 |
| 2008/0273623 A1 | 11/2008 | Chung et al. |
| 2010/0078701 A1 | 4/2010 | Shim et al. |
| 2010/0082890 A1 | 4/2010 | Heo et al. |
| 2010/0117141 A1 | 5/2010 | Shin et al. |
| 2010/0140685 A1 | 6/2010 | Kang et al. |
| 2010/0213527 A1 | 8/2010 | Shim et al. |
| 2010/0224929 A1 | 9/2010 | Jeong et al. |
| 2010/0229001 A1 | 9/2010 | Park et al. |
| 2010/0229007 A1 | 9/2010 | Park |
| 2010/0259983 A1 | 10/2010 | Yoon |
| 2010/0306583 A1 | 12/2010 | Kim et al. |
| 2010/0315875 A1 | 12/2010 | Kim et al. |
| 2010/0322000 A1 | 12/2010 | Shim et al. |
| 2011/0013458 A1 | 1/2011 | Seol |
| 2011/0018036 A1 | 1/2011 | Hwang et al. |
| 2014/0003129 A1 | 1/2014 | Rho |
| 2015/0036410 A1 * | 2/2015 | Ogiwara .................. G11C 7/065 365/72 |

FOREIGN PATENT DOCUMENTS

| | | |
|---|---|---|
| JP | 2008084439 | 4/2008 |
| KR | 0795647 | 1/2008 |

* cited by examiner

FIG. 1

| 1_1 | 1_2 | 1_3 | 1_4 | 1_5 | 1_6 | 1_7 | 1_8 |
|---|---|---|---|---|---|---|---|
| BLK7 | BLK7 | BLK7 | BLK7 | BLK7 | BLK7 | BLK7 | BLK7 |
| BLK6 | BLK6 | BLK6 | BLK6 | BLK6 | BLK6 | BLK6 | BLK6 |
| BLK5 | BLK5 | BLK5 | BLK5 | BLK5 | BLK5 | BLK5 | BLK5 |
| BLK4 | BLK4 | BLK4 | BLK4 | BLK4 | BLK4 | BLK4 | BLK4 |
| BLK3 | BLK3 | BLK3 | BLK3 | BLK3 | BLK3 | BLK3 | BLK3 |
| BLK2 | BLK2 | BLK2 | BLK2 | BLK2 | BLK2 | BLK2 | BLK2 |
| BLK1 | BLK1 | BLK1 | BLK1 | BLK1 | BLK1 | BLK1 | BLK1 |
| BLK0 | BLK0 | BLK0 | BLK0 | BLK0 | BLK0 | BLK0 | BLK0 |
| SA/WD(2_1) | | SA/WD(2_2) | | SA/WD(2_3) | | SA/WD(2_4) | |
| PERIPHERY(3) | | | | | | | |
| SA/WD(2_8) | | SA/WD(2_7) | | SA/WD(2_6) | | SA/WD(2_5) | |
| BLK7 | BLK7 | BLK7 | BLK7 | BLK7 | BLK7 | BLK7 | BLK7 |
| BLK6 | BLK6 | BLK6 | BLK6 | BLK6 | BLK6 | BLK6 | BLK6 |
| BLK5 | BLK5 | BLK5 | BLK5 | BLK5 | BLK5 | BLK5 | BLK5 |
| BLK4 | BLK4 | BLK4 | BLK4 | BLK4 | BLK4 | BLK4 | BLK4 |
| BLK3 | BLK3 | BLK3 | BLK3 | BLK3 | BLK3 | BLK3 | BLK3 |
| BLK2 | BLK2 | BLK2 | BLK2 | BLK2 | BLK2 | BLK2 | BLK2 |
| BLK1 | BLK1 | BLK1 | BLK1 | BLK1 | BLK1 | BLK1 | BLK1 |
| BLK0 | BLK0 | BLK0 | BLK0 | BLK0 | BLK0 | BLK0 | BLK0 |
| 1_16 | 1_15 | 1_14 | 1_13 | 1_12 | 1_11 | 1_10 | 1_9 |

4000

NONVOLATILE MEMORY DEVICE AND METHOD FOR SENSING THE SAME

CROSS-REFERENCE TO RELATED APPLICATIONS

This application is based on and claims priority from Korean Patent Application No. 10-2014-0099083, filed on Aug. 1, 2014 in the Korean Intellectual Property Office, the disclosure of which is incorporated herein in its entirety by reference.

BACKGROUND

1. Field of the Inventive Concept

The present inventive concept relates to a nonvolatile memory device and a method for sensing the same.

2. Background

A nonvolatile memory device (resistive memory device) using a resistance material includes a phase change random access memory (PRAM) or a phase change memory (PCM), a resistive RAM (ReRAM), a magnetic RAM (MRAM), and the like. A dynamic RAM (DRAM) or a flash memory stores data using charges, whereas a nonvolatile memory device using the resistance material stores data using the state change of a phase change material such as a chalcogenide alloy (in the case of a PRAM), a resistance change of a variable resistance material (in the case of an RRAM), a resistance change of a magnetic tunnel junction (MTJ) according to a magnetization state of a ferromagnetic material (in the case of an MRAM), and the like.

Here, a phase change memory device will be described as an example. A state of a phase change material is changed to a crystal state or an amorphous state while the phase change material is cooled after being heated. The phase change material in a crystal state has low resistance, and the phase change material in an amorphous state has high resistance. Accordingly, the crystal state may be defined as set data or 0 data, and the amorphous state may be defined as reset data or 1 data.

SUMMARY

It would be desirable to provide a nonvolatile memory device including a resistive memory element that can improve read latency, implement high-speed sensing, and improve precharging speed. It would also be desirable to provide a method for sending a nonvolatile memory device that can improve read latency, implement high-speed sensing, and improve precharging speed.

Advantages, objects, and features of the inventive concept will be discernible in part in the description which follows and will be apparent to those having ordinary skill in the art upon examination of the following or may be learned from practice of the inventive concept.

According to one aspect of the present inventive concept, a nonvolatile memory device comprises a first resistive memory cell connected to a first word line, a second resistive memory cell connected to a second word line that is different from the first word line, a clamping unit connected between a sensing node and the first resistive memory cell and configured to provide a clamping bias to the first resistive memory cell, a reference current supplying unit connected to the second resistive memory cell and configured to supply a reference current, and a sense amplifier connected to the sensing node, the sense amplifier being configured to sense a level change of the sensing node, such that wherein when the first word line is enabled, the second word line is disabled.

According to another aspect of the present inventive concept, a nonvolatile memory device comprises a first resistive memory cell connected to a first bit line, a second resistive memory cell connected to a second bit line that is complementary to the first bit line, a sensing node connected to the first resistive memory cell, a reference node connected to the second resistive memory cell, a first clamping unit connected to the bit line so as to provide a first clamping bias to the first resistive memory cell, a reference current supplying unit connected to the reference node and the second resistive memory cell so as to supply a reference current, and a sense amplifier connected to the sensing node and the reference node so as to compare a sensing level of the sensing node with a reference level of the reference node determined according to operation of the reference current supplying unit.

According to yet another aspect of the present inventive concept, a method of sensing a nonvolatile memory device comprises connecting a first resistive memory cell to a first word line, connecting a second resistive memory cell to a second word line that is different from the first word line, connecting a clamping unit between a sensing node and the first resistive memory cell and to provide a clamping bias to the first resistive memory to cell, connecting a reference current supplying unit to the second resistive memory cell to supply a reference current, and connecting a sense amplifier to the sensing node to sense a level change of the sensing node, such that when the first word line is enabled, the second word line is disabled.

BRIEF DESCRIPTION OF THE DRAWINGS

Features and advantages of the present inventive concept will be more apparent from the following detailed description taken in conjunction with the accompanying drawings, in which:

FIG. 1 is a block diagram for explaining a nonvolatile memory device according to some embodiments of the present inventive concept;

DETAILED DESCRIPTION OF THE EMBODIMENTS

Figure 2:
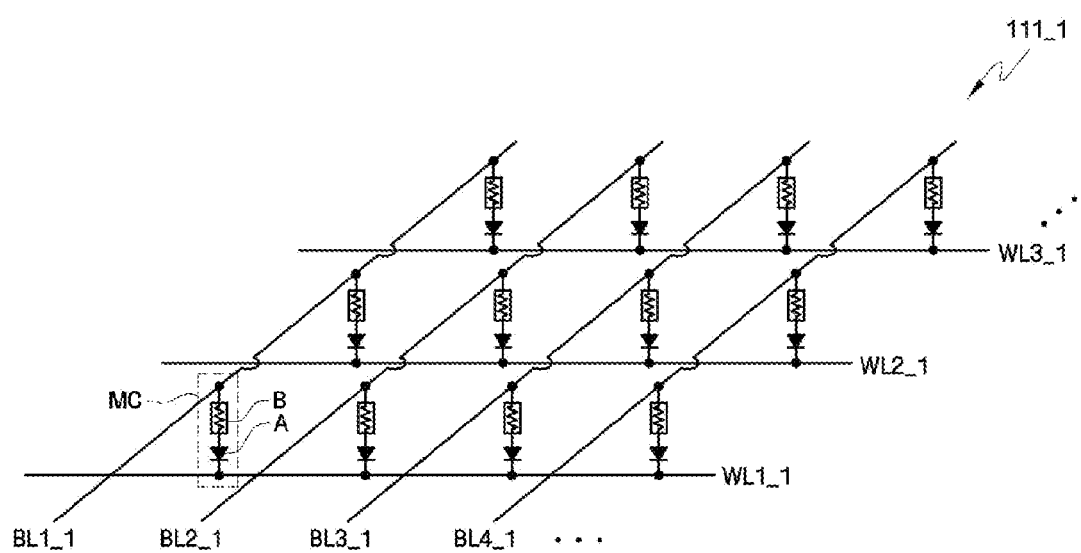
FIGS. 2 and 3 are views for explaining a memory cell array of FIG. 1.

One or more embodiments of the present inventive concept will now be described more fully hereinafter with reference to the accompanying drawings, in which one or more embodiments of the inventive concept are shown, including preferred embodiment(s). This inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. The same reference numbers indicate the same components throughout the specification. In the attached figures, the thickness of layers and regions may be exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the inventive concept (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to") unless otherwise noted.

Unless defined otherwise, all technical and scientific terms used herein have the same meaning as commonly understood by one of ordinary skill in the art to which this inventive concept belongs. It is noted that the use of any and all examples, or exemplary terms provided herein is intended merely to better illuminate the inventive concept and is not a limitation on the scope of the inventive concept unless otherwise specified. Further, unless defined otherwise, all terms defined in generally used dictionaries may not be overly interpreted.

The present inventive concept will be described with reference to perspective views, cross-sectional views, and/or plan views, in which preferred embodiments of the inventive concept are shown. Thus, the profile of an exemplary view may be modified according to manufacturing techniques and/or allowances. That is, the embodiments of the inventive concept are not intended to limit the scope of the present inventive concept but cover all changes and modifications that can be caused due to a change in manufacturing process. Thus, regions shown in the drawings are illustrated in schematic form and the shapes of the regions are presented simply by way of illustration and not as a limitation.

In an embodiment of the present inventive concept, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each to underlying level of the array.

In an embodiment of the present inventive concept, the 3D memory array includes vertical NAND strings that are vertically oriented such that at least one memory cell is located over another memory cell. The at least one memory cell may comprise a charge trap layer.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Hereinafter, embodiments of the present inventive concept will be described using a phase change random access memory (PRAM). However, it will be apparent to those skilled in the art to which the present inventive concept pertains that the present inventive concept can be applied to all nonvolatile memory devices using a resistance material, such as a resistive RAM (ReRAM), a magnetic RAM (MRAM), or a ferroelectric RAM (FRAM).

FIG. 1 is a block diagram explaining a nonvolatile memory device according to some embodiments of the present inventive concept. In FIG. 1, for convenience in explanation, a nonvolatile memory device composed of 16 memory banks is exemplified, but the present inventive concept is not limited thereto.

Referring to FIG. 1, a nonvolatile memory device according to some embodiments of the present inventive concept includes a memory cell array, a plurality of sense amplifiers and write drivers 2_1 to 2_8, and a peripheral circuit region 3.

The memory cell array may include a plurality of memory banks 1_1 to 1_16, and each of the memory banks 1_1 to 1_16 may include a plurality of memory blocks BLK0 to BLK7. Each of the memory blocks BLK0 to BLK7 may include a plurality of nonvolatile memory cells arranged in a matrix form. In FIG. 1, it is exemplified that the memory blocks BLK0 to BLK7 are arranged 8 by 8, but embodiments are not limited thereto.

Further, although not illustrated in detail in the drawing, a row selection to circuit and a column selection circuit, which designate rows and columns of resistive memory cells to be written/read corresponding to the memory banks 1_1 to 1_16, are arranged.

The sense amplifiers and write drivers 2_1 to 2_8 are arranged to correspond to two columns of memory banks 1_1 to 1_16, and configured to perform read and write operations in the corresponding memory banks 1_1 to 1_16.

In FIG. 1, it is exemplified that the sense amplifiers and write drivers 2_1 to 2_8 correspond to two columns of memory banks 1_1 to 1_16, but the present inventive concept is not limited thereto. That is, the sense amplifiers and write drivers 2_1 to 2_8 may be arranged to correspond to one column or four columns of memory banks for example.

In the peripheral circuit region 3, a plurality of logic circuit blocks for operating the column selection circuit, the row selection circuit, the sense amplifiers and write drivers 2_1 to 2_8, and a voltage generator may be arranged.

Referring to FIG. 2, the memory cell array of FIG. 1 may have a cross point structure. The cross point structure means a structure in which one memory cell is formed in a region where one line and another line cross each other.

For example, bit lines BL1_1 to BL4_1 may be formed to extend in a first direction, word lines WL1_1 to WL3_1 may be formed to extend in a second direction so that the word lines cross the bit lines BL1_1 to BL4_1, and resistive memory cells MC may be formed in regions where the bit lines BL1_1 to BL4_1 and the word lines WL1_1 to WL3_1 cross each other.

Figure 3:
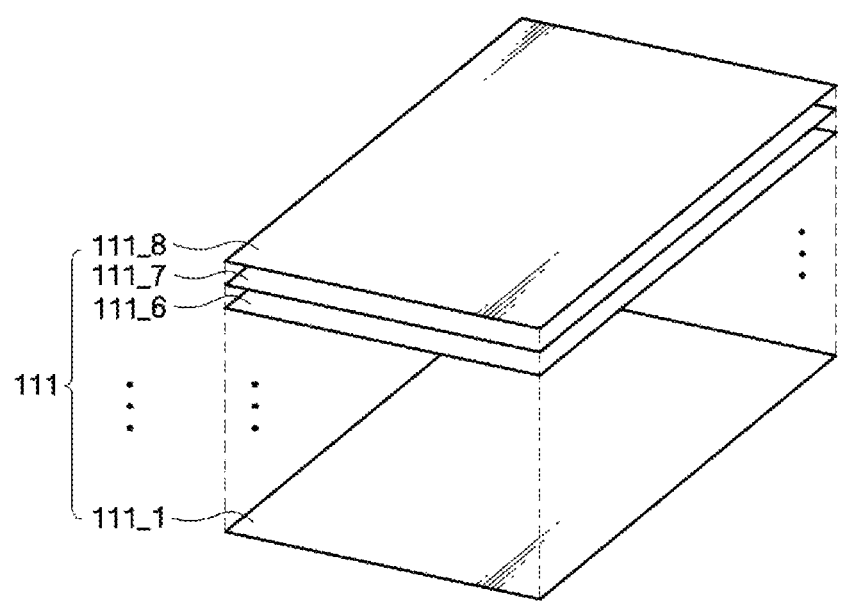

Further, as illustrated in FIG. 3, the memory cell array may have a three-dimensional (3D) laminated structure. The 3D laminated structure means a form in which a plurality of memory cell layers 111_1 to 111_8 are vertically laminated.

In FIG. 3, it is exemplified that 8 memory cell layers 111_1 to 111_8 are laminated, but the present inventive concept is not limited thereto. Here, the respective memory cell layers 111_1 to 111_8 may include a plurality of memory cell groups and/or a plurality of redundancy memory cell groups. In the case where the memory cell array has a 3D laminated structure, the respective memory cell layers 111_1 to 111_8 may have to the cross point structure as illustrated in FIG. 2, but are not limited thereto.

Figure 4:
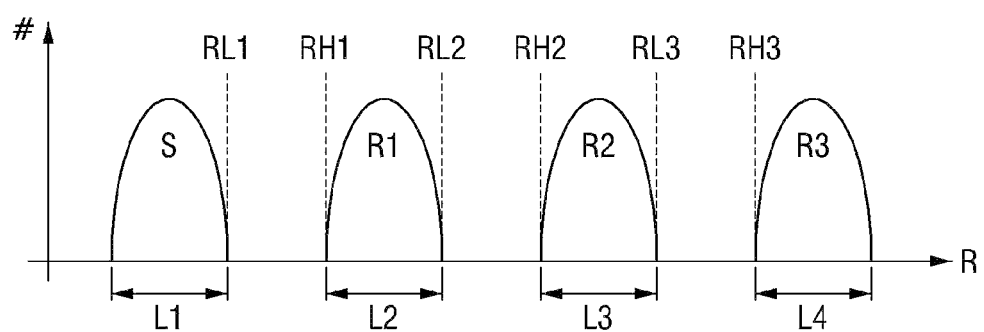
FIGS. 4 and 5 are diagrams for explaining resistance distribution of a resistive memory cell that is used in a nonvolatile memory device according to some embodiments of the present inventive concept.
Figure 5:
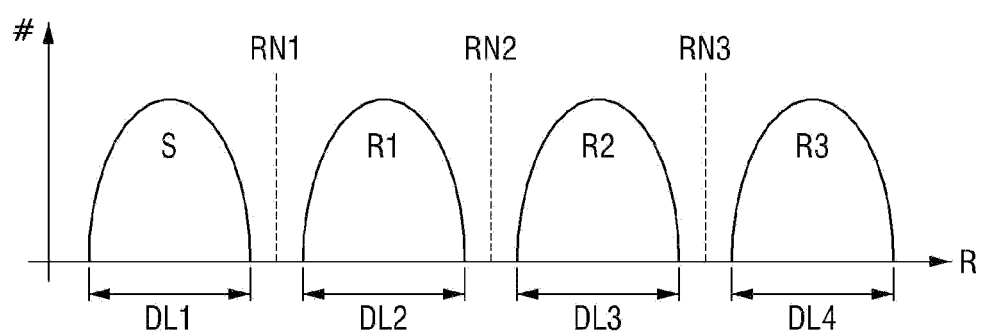

FIGS. 4 and 5 are diagrams for explaining resistance distribution of resistive memory cells used in a nonvolatile memory device according to some embodiments of the present inventive concept.

First, referring to FIG. 4, the resistive memory cell may be a multi-bit cell. The resistive memory cell may store any one of first data to fourth data S, R1, R2, R3. The resistance distribution in FIG. 4 may be the distribution just after a write operation.

The first data S to the fourth data R3 may correspond to first to fourth resistance levels L1, L2, L3, L4, respectively. The first to fourth resistance levels L1, L2, L3, L4 may have resistance values that increase in order of the first to fourth resistance levels L1, L2, L3, L4. For example, the first resistance level L1 is lower than RL1, the second resistance level L2 is higher than RH1 and is lower than RL2, the third resistance level L3 is higher than RH2 and is lower than RL3, and the fourth resistance level L4 is higher than RH3. Here, RL1, RL2, RL3, RH1, RH2, and RH3 may be reference values for use in a verification read operation for confirming whether a write has been accurately performed during a write operation.

On the other hand, the resistance distribution illustrated in FIG. 5 may be the distribution after a predetermined time elapses after a write operation. That is, the first data S to the fourth data R3 may correspond to first to fourth resistance levels DL1, DL2, DL3, DL4. It can be known that widths of the first to fourth resistance levels DL1, DL2, DL3, DL4 as illustrated in FIG. 5 are greater than the widths of the first to fourth resistance levels L1, L2, L3, L4 as illustrated in FIG. 4.

RN1 denotes a resistance value located between the first resistance level DL1 and the second resistance level DL2. RN2 denotes a resistance value located between the second resistance level DL2 and the third resistance level DL3. RN3 denotes a resistance value located between the third resistance level DL3 and the fourth resistance level DL4. Here, resistance values RN1 to RN3 may be reference values for use in a normal read operation. For example, the resistive memory cell having a resistance value lower than RN1 may store the first data S.

Figure 6:
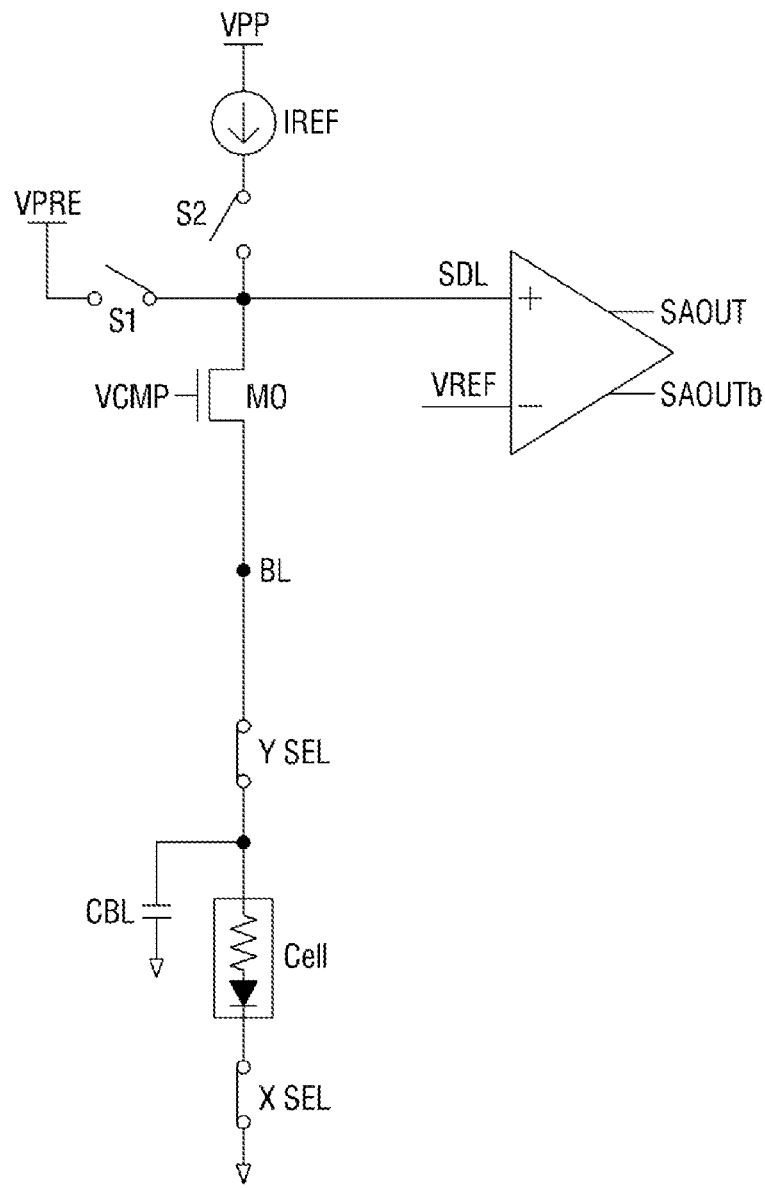
FIGS. 6 and 7 are a circuit diagram and a timing diagram for explaining a single ended sensing method of a nonvolatile memory device.
Figure 7:
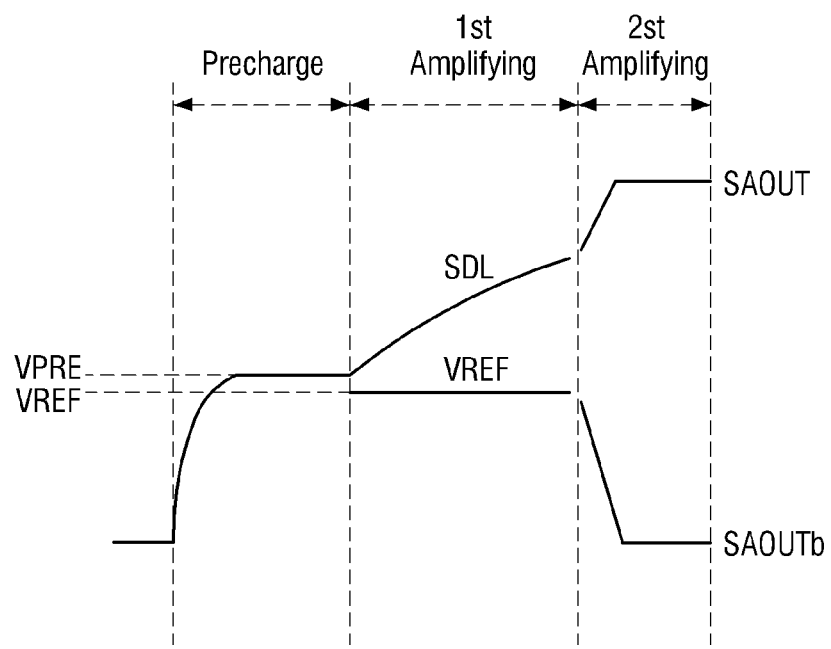
Figure 8:
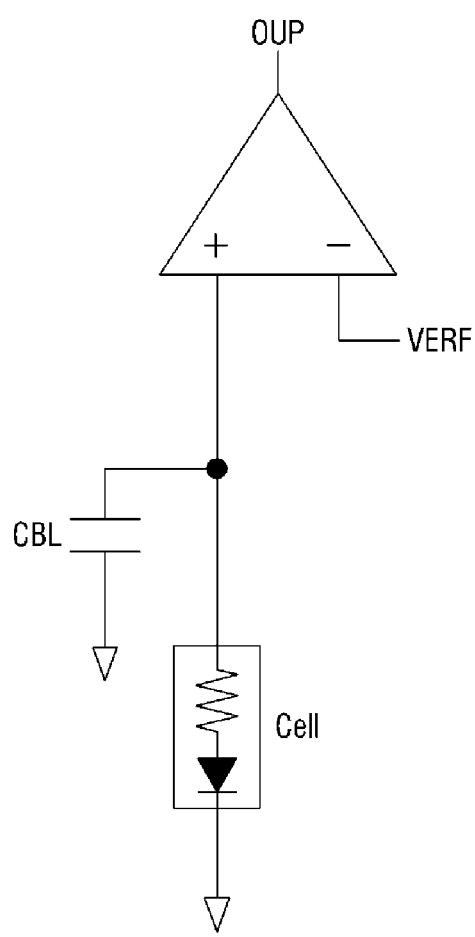
FIG. 8 is a circuit diagram schematically illustrating a single ended sensing structure of a nonvolatile memory device.
Figure 9:
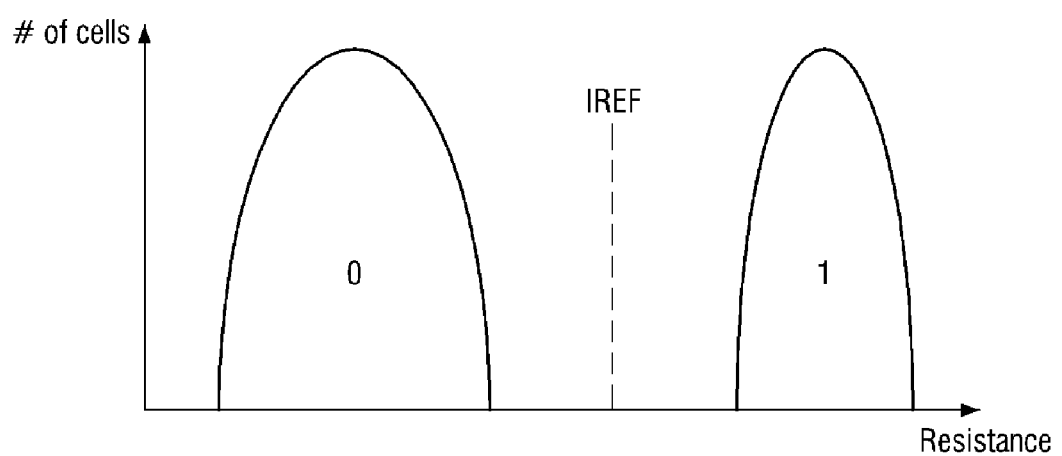
FIG. 9 is a graph illustrating reference current and resistance dispersion in a single ended sensing structure of a nonvolatile memory device.

FIGS. 6 and 7 are a circuit diagram and a timing diagram for explaining a single ended sensing method of a nonvolatile memory device. FIG. 8 is a circuit diagram schematically illustrating a single ended sensing structure of a nonvolatile memory device, and FIG. 9 is a graph illustrating reference current and resistance dispersion in a single ended sensing structure of a nonvolatile memory device.

Generally, in a nonvolatile memory device including a resistive memory element, a single ended sensing method may be used as a sensing method during a read operation. Referring to FIGS. 6 to 9, a single ended sensing structure of a PRAM is illustrated. In performing a sensing operation, the electric potential between both ends of a cell should be kept equal to or lower than a threshold voltage Vth of the resistive memory element to prevent the occurrence of a destructive read. For this, a clamping transistor M0 (FIG. 6) is connected thereto.

In the single ended sensing structure, a reference voltage VREF is provided using an external fixed voltage. During the sensing operation for discriminating whether the cell has high resistance or low resistance, a first switch S1 is first closed, and a precharging operation is performed. After the precharging operation, a second switch S2 is closed for developing operation, and a reference current IREF is applied. If the cell has high resistance, the voltage of an SDL node rises to be higher than the reference voltage VREF, and a comparator outputs data (1). If the cell has low resistance, the voltage of the SDL node falls to be lower than the reference voltage VREF, and the comparator outputs data (0).

The single-ended sensing method as described above has the problem that as the cell density is increased and as miniaturized cell scaling is implemented, the resistive-capacitive (RC) component of the bit line is increased to reduce the sensing speed.

Figure 10:
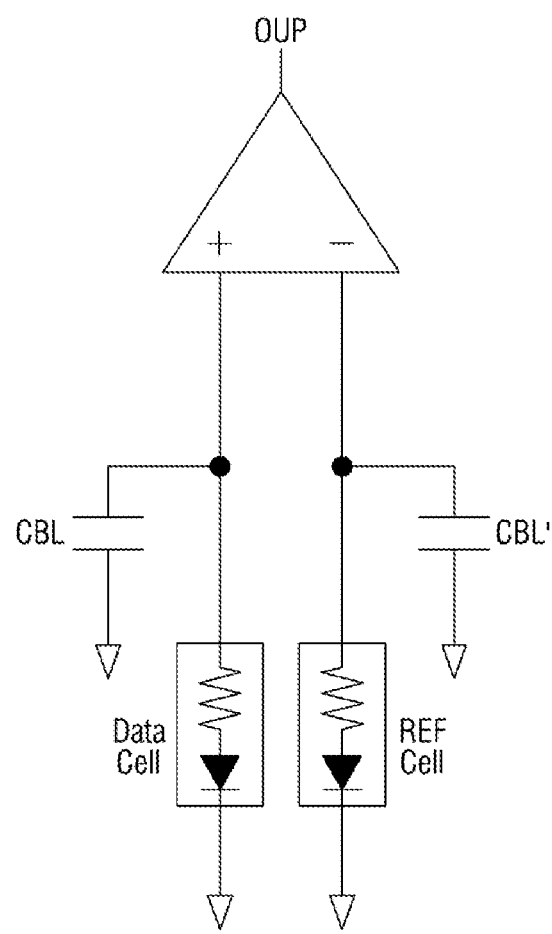
FIG. 10 is a circuit diagram schematically illustrating a differential sensing structure.
Figure 11:
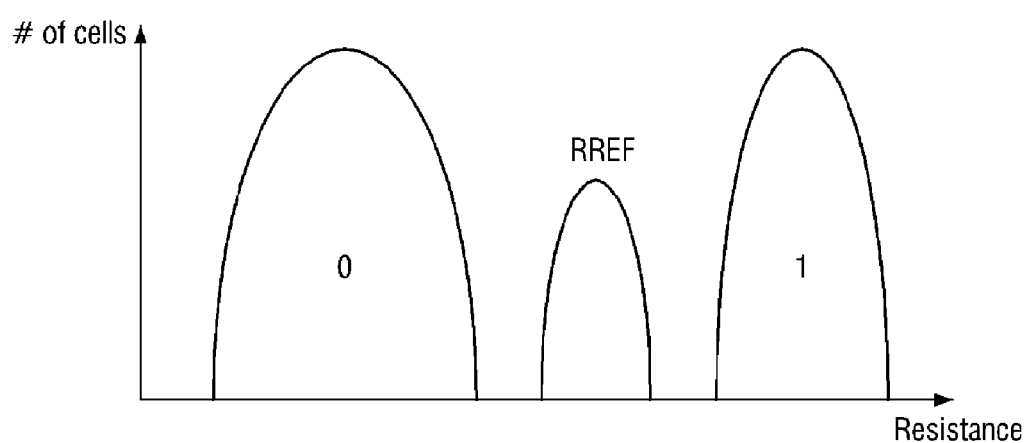
FIG. 11 is a graph illustrating a reference cell and resistance dispersion in a differential sensing structure.

FIG. 10 is a circuit diagram schematically illustrating a differential sensing structure, and FIG. 11 is a graph illustrating a reference cell and resistance dispersion in the differential sensing structure.

In general, referring to FIG. 10, a differential sensing method is used to improve the sensing speed. In order to implement such a differential sensing structure, a reference cell is used among resistive memory cells. However, as shown in FIG. 11, since the reference cell forms dispersion, sensing margins are decreased to cause the yield also to be decreased.

Figure 12:
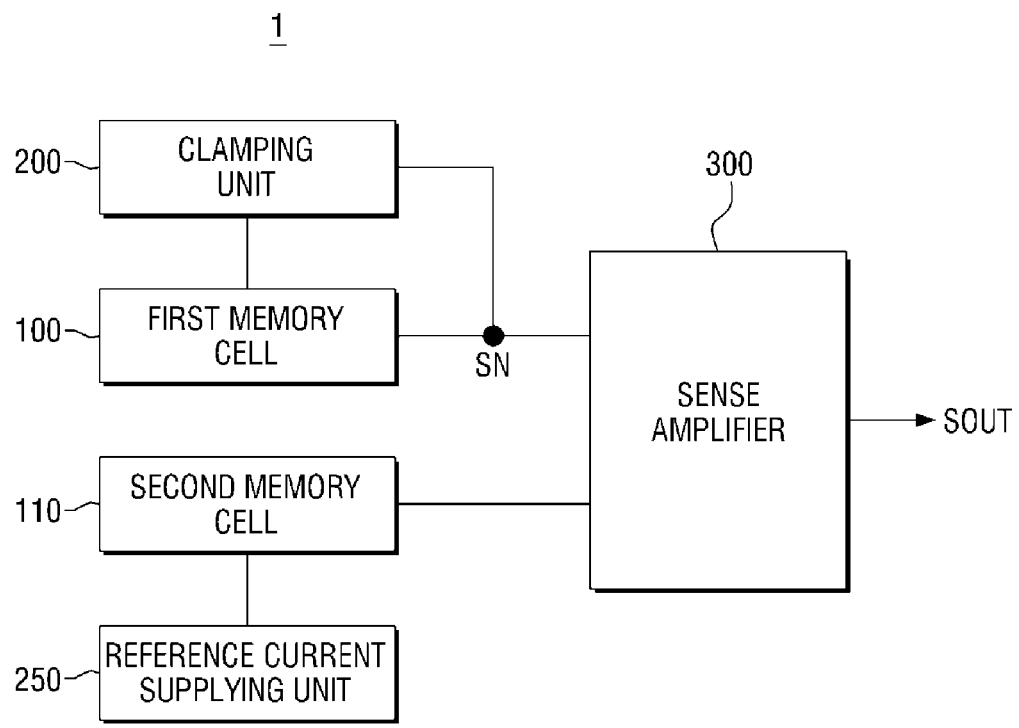
FIG. 12 is a block diagram for explaining a nonvolatile memory device according to an embodiment of the present inventive concept.
Figure 13:
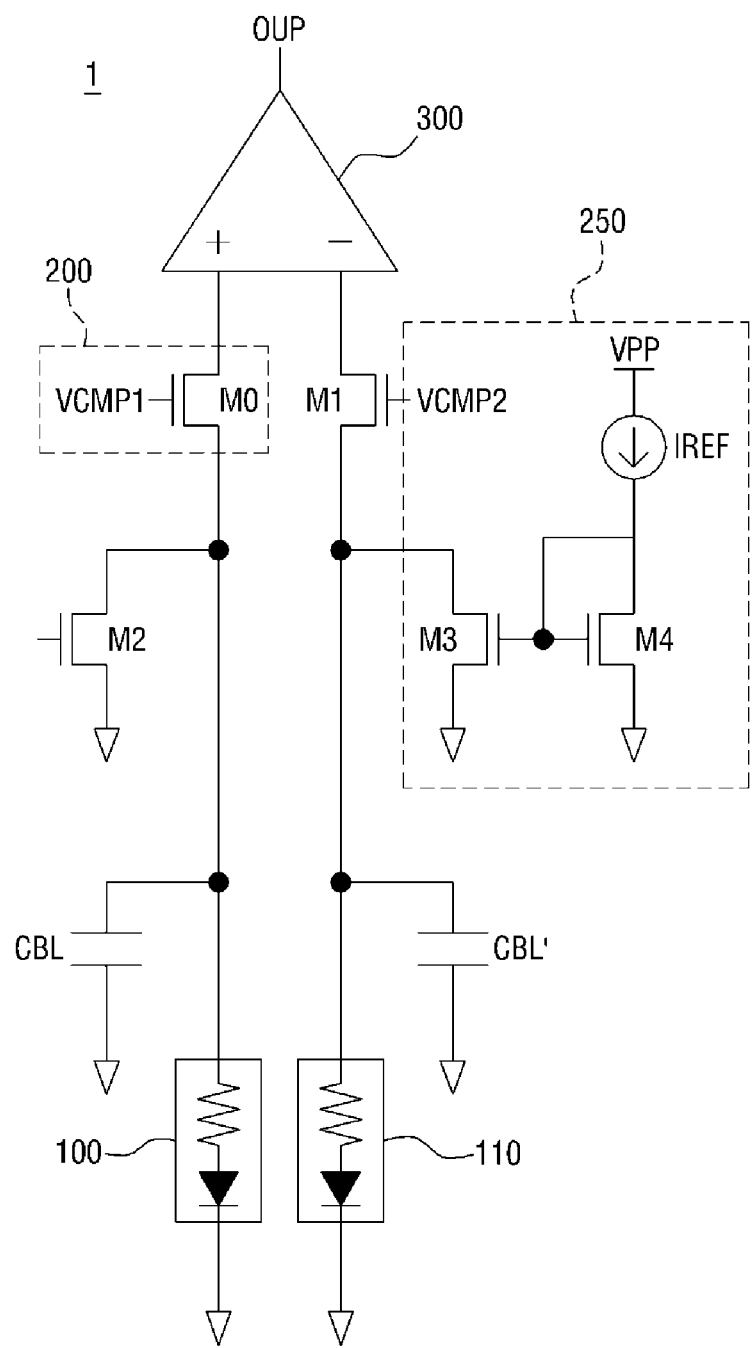
FIG. 13 is an exemplary circuit diagram of the nonvolatile memory device of FIG. 12.
Figure 14:
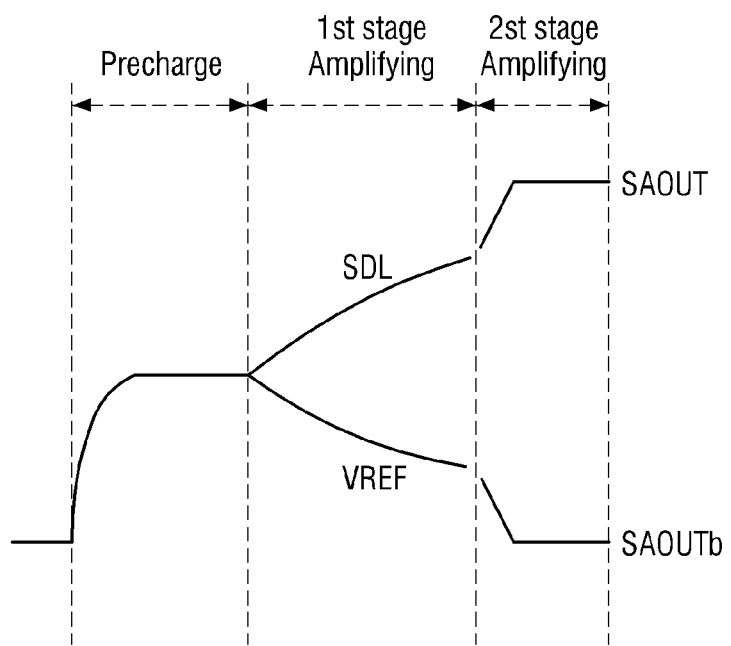
FIG. 14 is a timing diagram for explaining a method for sensing a nonvolatile memory device according to an embodiment of the present inventive concept.
Figure 15:
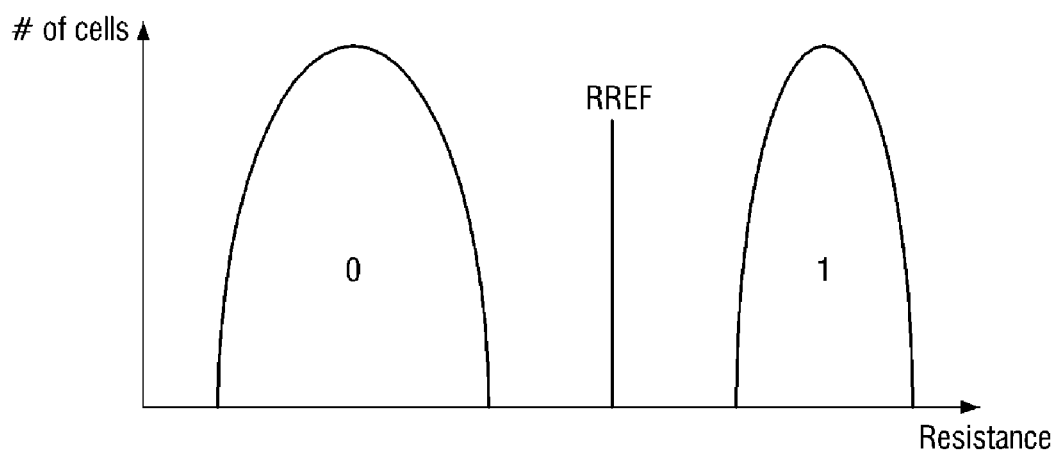
FIG. 15 is a graph illustrating a reference cell and resistance dispersion in a differential sensing structure of a nonvolatile memory device according to an embodiment of the present inventive concept.

FIG. 12 is a block diagram explaining a nonvolatile memory device according to an embodiment of the present inventive concept, and FIG. 13 is an exemplary circuit diagram of the nonvolatile memory device of FIG. 12. FIG. 14 is a timing diagram explaining a method for sensing a nonvolatile memory device according to an embodiment of the present inventive concept, and FIG. 15 is a graph illustrating a reference cell and resistance dispersion in a differential sensing structure of a nonvolatile memory device according to an embodiment of the present inventive concept.

Referring to FIGS. 12 and 13, a nonvolatile memory device 1 according to an embodiment of the present inventive concept includes a first resistive memory cell 100, a second resistive memory cell 110, a clamping unit 200, a reference current supplying unit 250, and a sense amplifier 300.

The illustrated first resistive memory cell 100 is a resistive memory cell selected to be read from among a plurality of resistive memory cells in the memory cell array. Here, if the first resistive memory cell 100 is a PRAM, the first resistive memory cell 100 may include a variable resistance element GST having a phase change material and an access element D controlling current that flows to the variable resistance element GST.

Here, the access element D may be a diode or a transistor that is connected in series to the variable resistance element GST. As the phase change materials, various kinds of materials may be used, such as GaSb, InSb, InSe, Sb2Te3, and GeTe, in which two elements are combined, GeSbTe, GaSeTe, InSbTe, SnSb2Te4, and InSbGe, in which three elements are combined, and AgInSbTe, (GeSn)SbTe, GeSb (SeTe), and Te81Ge15Sb2S2, in which four elements are combined. Among them, GeSbTe, which is composed of germanium (Ge), antimony (Sb), and tellurium (Te), may be mainly used.

On the other hand, if the first resistive memory cell 100 is an RRAM, the variable resistance element GST may include, for example, NiO or perovskite. The perovskite may be a composition, such as manganite ($Pr_{0.7}Ca_{0.3}MnO_3$, $Pr_{0.5}Ca_{0.5}MnO_3$, other PCMO, LCMO, and the like), titernate (STO:Cr), and zirconate (SZO:Cr, $Ca_2Nb_2O_7$:Cr, and $Ta_2O_5$:Cr). A filament may be formed in the variable resistance element, and the filament becomes a current path of cell current that penetratingly flows through the resistive memory cell.

Further, the second resistive memory cell 110 is a resistive memory cell selected to provide reference current IREF among a plurality of resistive memory cells in the memory cell array. If the second resistive memory cell 110 is a PRAM in the same manner as the first resistive memory cell 100, the second resistive memory cell 110 may include a variable resistance element GST having a phase change material and an access element D controlling current that flows to the variable resistance element GST.

In the same manner as described above, the access element D may be a diode or a transistor that is connected in series to the variable resistance element GST. As the phase change materials, various kinds of materials in which two to four elements are combined may be used, and the kinds of the materials may be the same as those as described above for example. In the second resistive memory cell 110, the variable resistance element may include, for example, NiO or perovskite.

The first resistive memory cell 100 may be connected to the first word line WL1, and the second resistive memory cell 110 may be connected to the second word line WL2, which is a different word line from the first word line WL1.

Further, the first resistive memory cell 100 may be connected to the first bit line BL, and the second resistive memory cell 110 may be connected to the second bit line BLb, which is a different bit line from the first bit line BL. In particular, the first bit line BL and the second bit line BLb may be in a complementary relationship.

The clamping unit 200 is connected between the first resistive memory cell 100 and a sensing node SN to clamp the level of the bit line within an appropriate readable range. Specifically, the clamping unit 200 provides a clamping bias VCMP1 to clamp the bit line level to a predetermined level that is equal to or lower than the threshold voltage Vth of the phase change material. This is because if the bit line level becomes higher than the threshold voltage Vth, the phase change material of the selected resistive memory cell 100 may be changed. As illustrated in FIG. 13, the clamping unit 200 may include an NMOS transistor M0 that is connected between the first resistive memory cell 100 and the sensing node SN.

The reference current supplying unit 250 is connected to the second bit line BLb to which the second resistive memory cell 110 is connected, and supplies the reference current IREF to the second bit line BLb. Further, as illustrated in FIG. 13, the reference current supplying unit 250 may include a current mirror circuit. The reference current supplying unit 250 may generate a fixed reference voltage VREF through supplying of the fixed reference current IREF to the second resistive memory cell 110. This becomes the reference level when the sense amplifier 300 senses the first resistive memory cell 100.

The sense amplifier 300 is connected to the sensing node SN to sense the level change of the sensing node SN. In particular, the sensing node SN is connected to the first resistive memory cell 100 and serves to sense the first resistive memory cell 100. Specifically, the sense amplifier 300 compares the level of the sensing node SN with a reference level to output the result of the comparison. The sense amplifier 300 may be a current sense amplifier or a voltage sense amplifier.

However, in relation to the operation of the nonvolatile memory device 1 according to the present inventive concept, the sense amplifier 300 senses the change of the sensing level from the reference level using the first resistive memory cell 100 connected to the first bit line BL and the second resistive memory cell 110 connected to the second bit line BLb. If the first word line WL1 connected to the first resistive memory cell 100 is enabled, the second word line WL2 connected to the second resistive memory cell 110 is disabled, and the sensing operation is performed.

In accordance with the sensing operation, it becomes possible to implement a pseudo differential sensing operation. The clamping unit 200 provides clamping bias VCMP1 to meet the characteristics of the PRAM cell and to prevent the occurrence of the destructive read. In order to implement the pseudo differential sensing operation, an unselected bit line (i.e., second bit line BLb) that has turned off the second word line WL2 is used to prevent cell current from flowing along the second resistive memory cell 110. Further, the amount of reference current IREF can be controlled from outside by acquiring only capacitor component from the unselected bit line (i.e., second bit line BLb) and providing clamping bias VCMP2 through insertion of an NMOS transistor M1. The selected bit line (i.e., first bit line BL) operates to prevent current from flowing to the NMOS transistor M1 and to make the current flow to the NMOS transistor M1 only in the case where the first resistive memory cell 100 is selected as a reference cell.

Referring to FIG. 14, during the sensing operation to discriminate whether the cell has high resistance or low resistance, the precharging operation is first performed. After completion of the precharging operation, the reference current IRFF is applied for the developing operation. If the cell has high resistance, the voltage of the SDL node rises to be higher than the reference voltage VREF, while if the cell has low resistance, the voltage of the SDL node falls to be lower than the reference voltage VREF.

Referring to FIG. 15, it can be known that it is possible to use the differential sensing method using the reference level RREF of the reference cell (i.e., second resistive memory cell 110).

A nonvolatile memory device according to other embodiments of the present inventive concept will now be described.

Figure 16:
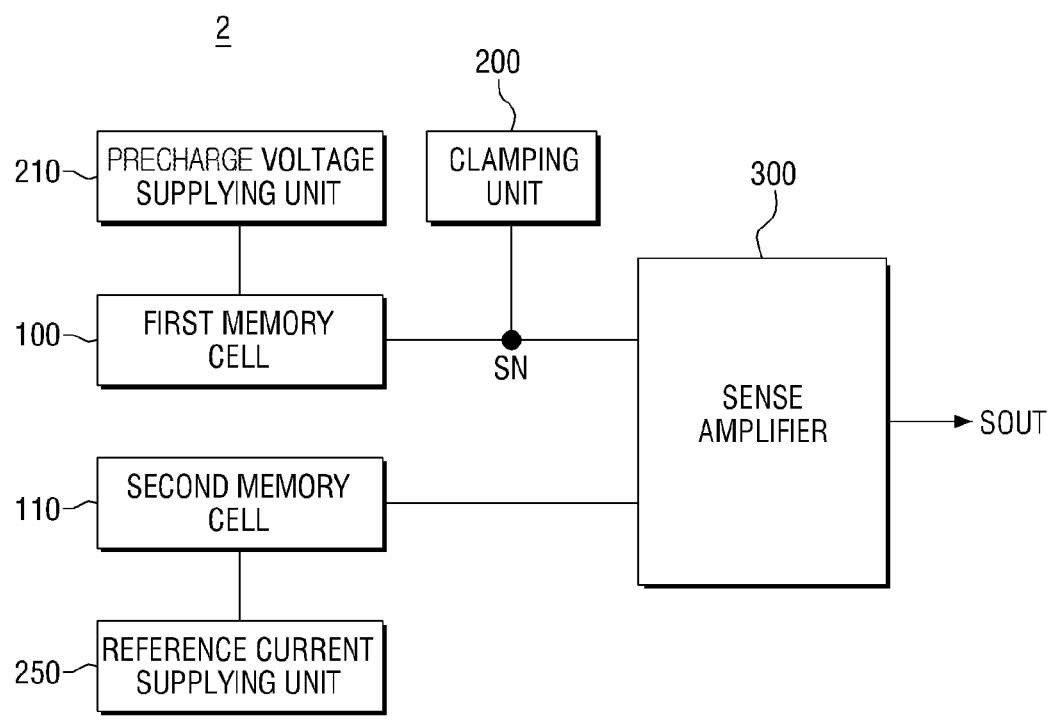
FIG. 16 is a block diagram for explaining a nonvolatile memory device according to another embodiment of the present inventive concept.
Figure 17:
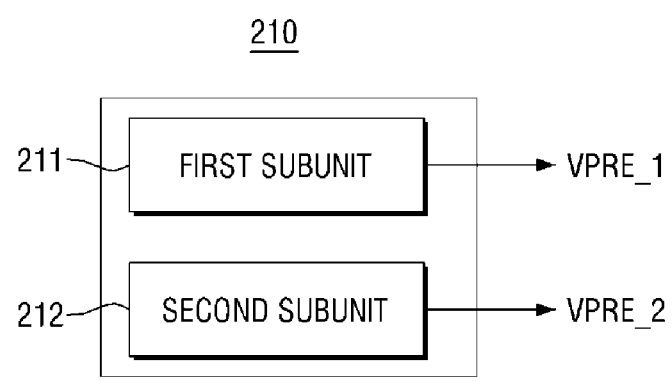
FIG. 17 is a block diagram concretely illustrating a precharge voltage supply unit.
Figure 18:
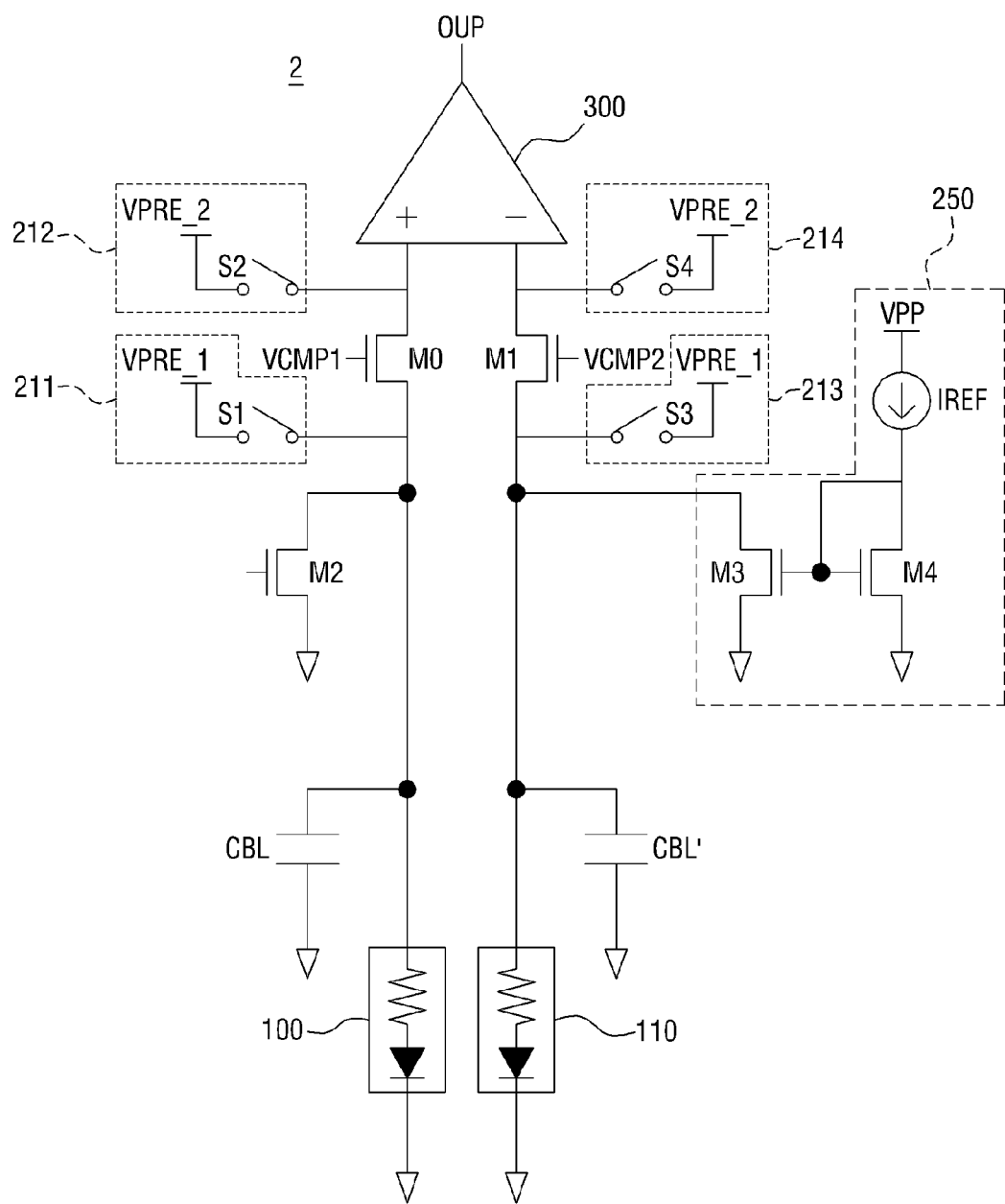
FIG. 18 is an exemplary circuit diagram of the nonvolatile memory device of FIG. 16.
Figure 19:
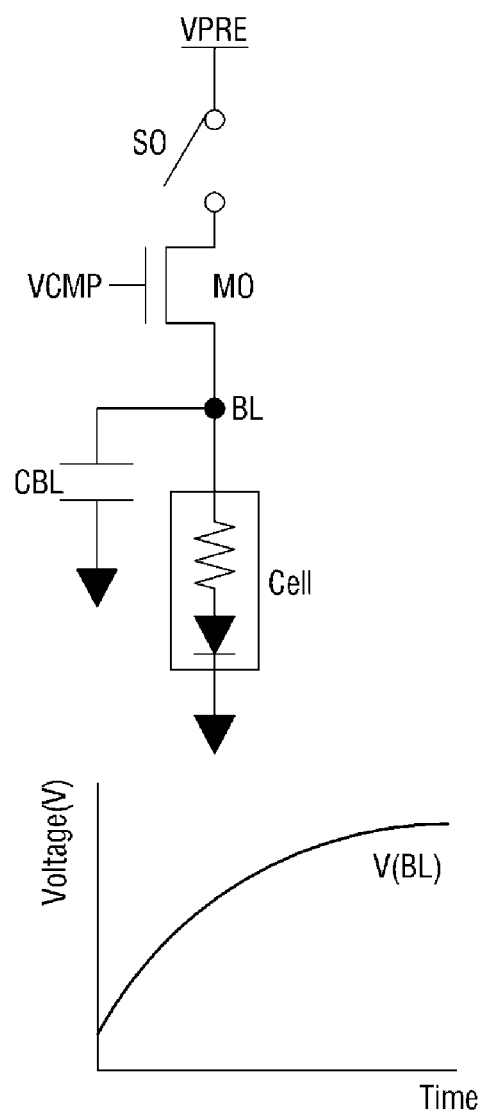
FIG. 19 is a diagram for explaining a precharging method in the related art.
Figure 20:
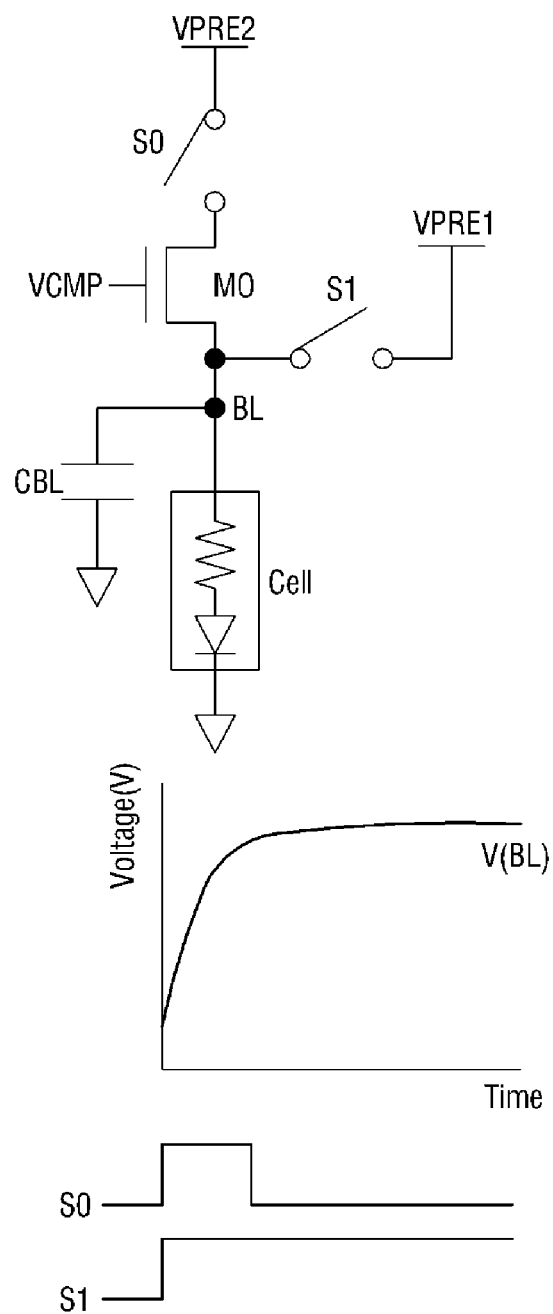
FIG. 20 is a diagram for explaining a precharging method according to the present inventive concept.

FIG. 16 is a block diagram for explaining a nonvolatile memory device according to another embodiment of the present inventive concept, and FIG. 17 is a block diagram illustrating a precharge voltage supply unit. FIG. 18 is an exemplary circuit diagram of the nonvolatile memory device of FIG. 16. FIG. 19 is a diagram explaining a precharging method in the related art, and FIG. 20 is a diagram for explaining a precharging method according to the present inventive concept. For convenience in explanation, explanation of the portions that are substantially the same as those of the nonvolatile memory device according to an embodiment of the present inventive concept as described above will be omitted.

Referring to FIGS. 16 to 18, a nonvolatile memory device 2 according to another embodiment of the present inventive concept includes a first resistive memory cell 100, a second resistive memory cell 110, a clamping unit 200, a precharge voltage supplying unit 210, a reference current supplying unit 250, and a sense amplifier 300.

The first resistive memory cell 100, the second resistive memory cell 110, the clamping unit 200, the reference current supplying unit 250, and the sense amplifier 300 are substantially the same as those as described above.

The precharge voltage supplying unit 210 supplies a precharge voltage VPRE to the first resistive memory cell 100. Specifically, in the nonvolatile memory device 2 according to the present inventive concept, the precharge voltage supplying unit 210 supplies a plurality of precharge voltages VPRE_1 and VPRE_2 to the first resistive memory cell 100, and includes a first sub-precharge voltage supplying unit 211 that supplies a first precharge voltage VPRE_1 and a second sub-precharge voltage supplying unit 212 that supplies a second precharge voltage VPRE_2.

In this case, time required for the second sub-precharge voltage supplying unit 212 to supply the second precharge voltage VPRE_2 to the first resistive memory cell 100 is longer than time required for the first sub-precharge voltage supplying unit 211 to supply the first precharge voltage VPRE_1 to the first resistive memory cell 100.

Referring to FIGS. 19 and 20, the voltage of the BL node can be rapidly precharged by supplying the first and second precharge voltages VPRE_1, VPRE_2. The precharging time exerts an influence on the operating time of the sensing operation, and thus if the precharging operation is rapidly completed, the operating time of the sensing operation can be decreased.

Figure 21:
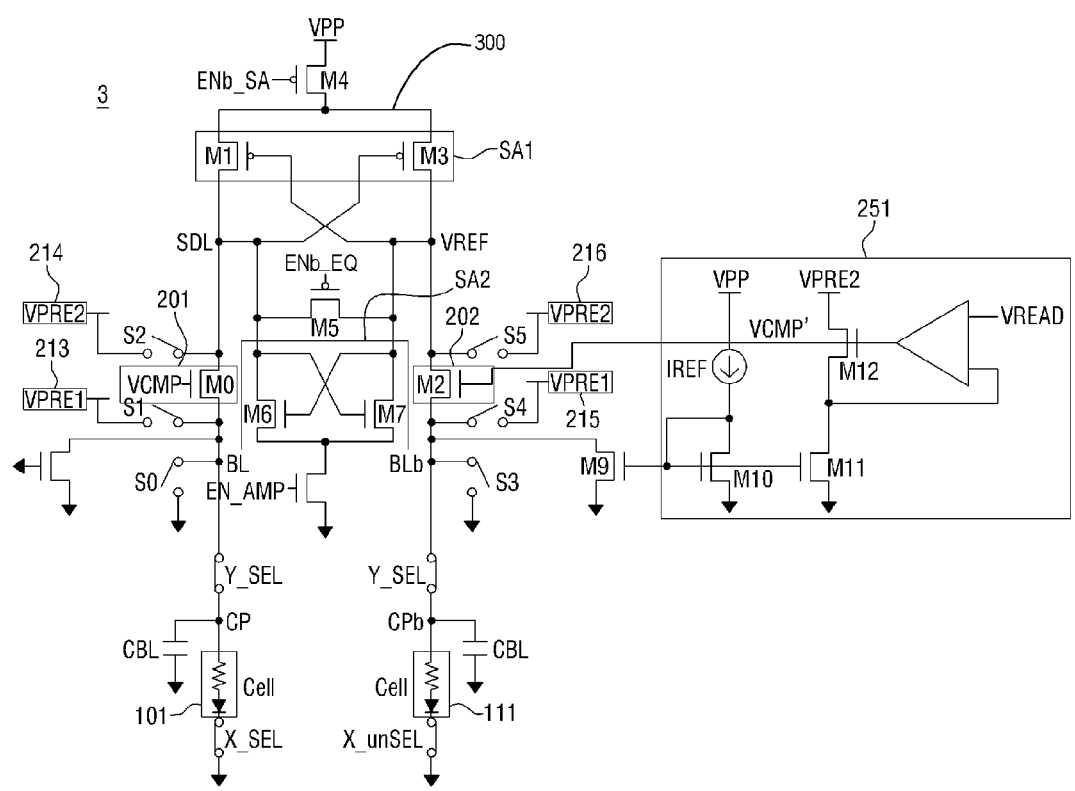
FIG. 21 is a block diagram for explaining a nonvolatile memory device according to still another embodiment of the present inventive concept.
Figure 22:
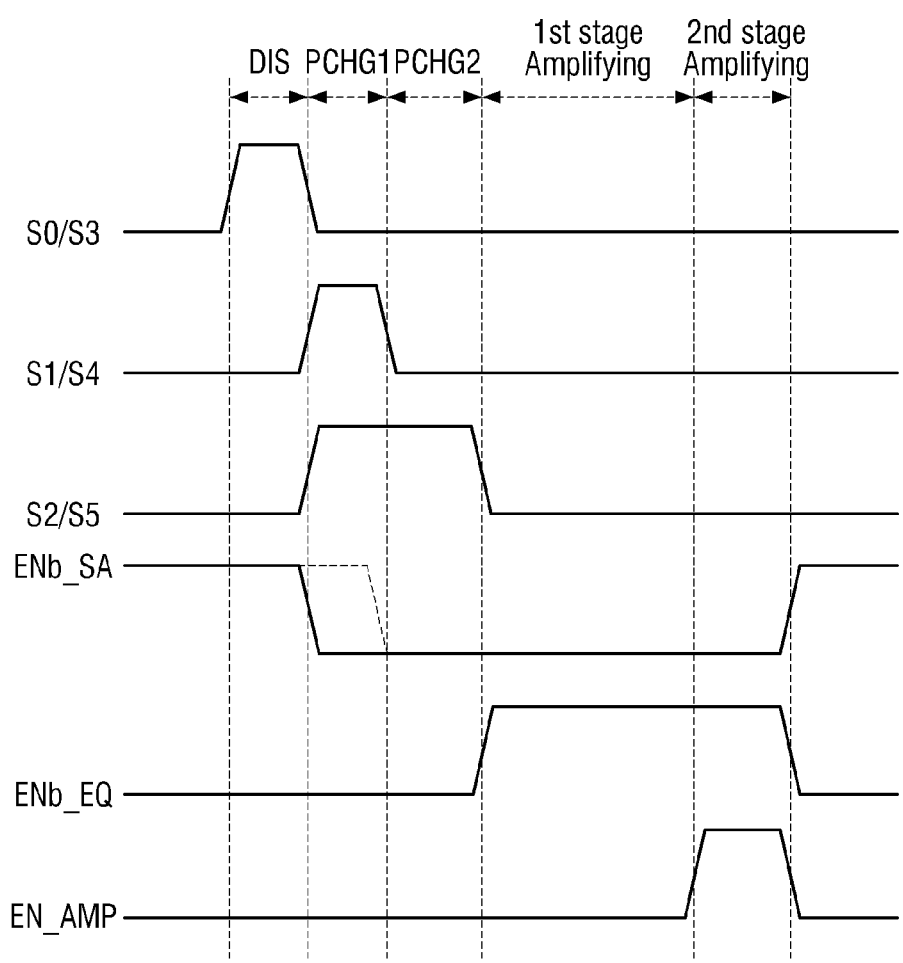
FIG. 22 is a timing diagram for explaining operation sequence of a nonvolatile memory device according to still another embodiment of the present inventive concept.

FIG. 21 is a block diagram explaining a nonvolatile memory device according to still another embodiment of the present inventive concept, and FIG. 22 is a timing diagram explaining operation sequence of a nonvolatile memory device according to still another embodiment of the present inventive concept. For convenience in explanation, explanation of the portions that are substantially the same as those of the nonvolatile memory device according to an embodiment of the present inventive concept as described above will be omitted.

Referring to FIGS. 21 and 22, a nonvolatile memory device 3 according to still another embodiment of the present inventive concept includes a first resistive memory cell 101, a second resistive memory cell 111, a sensing node SDL, a reference node VREF, a first clamping unit 201, a second clamping unit 202, a reference current supplying unit 251, and a sense amplifier 300.

The illustrated first resistive memory cell 101 is a resistive memory cell selected to be read among a plurality of resistive memory cells in the memory cell array. Here, if the first resistive memory cell 101 is a PRAM, the first resistive memory cell 101 may include a variable resistance element GST having a phase change material and an access element D controlling current that flows to the variable resistance element GST.

Further, the second resistive memory cell 111 is a resistive memory cell selected from among a plurality of resistive memory cells in the memory cell array to provide reference current IREF.

The first resistive memory cell 101 may be connected to the first bit line BL, and the second resistive memory cell 111 may be connected to the second bit line BLb. The first bit line BL and the second bit line BLb may be in a complementary relationship.

The sensing node SDL is a node in which the sense amplifier 300 senses the sensing level, and is connected to the first resistive memory cell 101. The reference node VREF is a node in which the sense amplifier 300 receives the reference level to sense the first resistive memory cell 101, and is connected to the second resistive memory cell 111.

The first clamping unit 201 is connected between the first resistive memory cell 101 and the sensing node SDL to clamp the level of the first bit line BL within an appropriate readable range. Specifically, the first clamping unit 201 provides a clamping bias VCMP to clamp the bit line level to a predetermined level that is equal to or lower than the threshold voltage Vth of the phase change material. The first clamping unit 201 includes an NMOS transistor M0.

The second clamping unit 202 is connected between the second resistive memory cell 111 and the reference node VREF to clamp the level of the second bit line BLb to a clamping bias VCMP'. Specifically, the amount of reference current IREF is controlled from an outside by providing the clamping bias VCMP' through insertion of an NMOS transistor M2.

The reference current supplying unit 251 is connected to the second bit line BLb to which the second resistive memory cell 111 is connected, and supplies the reference current IREF to the second bit line BLb. Further, as illustrated in FIG. 21, the reference current supplying unit 251 may include a current mirror circuit. The reference current supplying unit 251 may generate a fixed reference voltage through supplying of the fixed reference current IREF to the second resistive memory cell 111. This becomes the reference level when the sense amplifier 300 senses the first resistive memory cell 101.

The sense amplifier 300 is connected to the sensing node SDL and the reference node VREF, and compares the sensing level of the sensing node SDL with the reference level that is determined according to the operation of the reference current supplying unit 251 to sense the first resistive memory cell 101. The sense amplifier 300 may be a current sense amplifier or a voltage sense amplifier.

Specifically, the sense amplifier 300 may include a first latch circuit SA1 that performs first amplification A1 of a difference in level between the sensing node SDL and the reference node VREF, and a second latch circuit SA2 that performs second amplification A2 of the amplified difference in level between the sensing node SDL and the reference node VREF.

The first latch circuit SA1 may be a pair of PMOS transistors that are cross-coupled between the first bit line BL and the second bit line BLb, and the second latch circuit SA2 may be a pair of NMOS transistors that are cross-coupled between the first bit line BL and the second bit line BLb.

The cross-coupled transistor pair means a structure in which gates of the pair of transistors connected between the first bit line BL and the second bit line BLb are connected to cross the first bit line BL and the second bit line BLb, and the same voltage is applied to a common source of the transistor pair.

Through the operation of the first latch circuit SA1 and the second latch circuit SA2, the difference in level between the sensing node SDL and the reference node VREF is amplified to increase the sensing sensitivity.

The precharge voltage supplying units 213, 214, 215, 216 supply precharge voltages VPRE1 and VPRE2 to the first and second resistive memory cells 101, 111. Specifically, the nonvolatile memory device 3 according to the present inventive concept includes the first sub-precharge voltage supplying unit 213 that supplies the first precharge voltage VPRE1 to the first resistive memory cell 101, the second sub-precharge voltage supplying unit 214 that supplies the second precharge voltage VPRE2 to the first resistive memory cell 101, the third sub-precharge voltage supplying unit 215 that supplies the first precharge voltage VPRE1 to the second resistive memory cell 111, and the fourth sub-precharge voltage supplying unit 216 that supplies the second precharge voltage VPRE2 to the second resistive memory cell 111.

In this case, time required for the second sub-precharge voltage supplying unit 214 to supply the second precharge voltage VPRE2 to the first resistive memory cell 101 is longer than time required for the first sub-precharge voltage supplying unit 213 to supply the first precharge voltage VPRE1 to the first resistive memory cell 101. Further, time required for the fourth sub-precharge voltage supplying unit 216 to supply the second precharge voltage VPRE2 to the second resistive memory cell 111 is longer than time required for the third sub-precharge voltage supplying unit 215 to supply the first precharge voltage VPRE1 to the second resistive memory cell 111.

Still referring to FIGS. 21 and 22, in the nonvolatile memory device 3 switches S1/S4 are first closed, and the first precharging operation is performed. After completion of the first precharging operation, switches S2/S5 are closed, and the second precharging operation is performed. Thereafter, a first signal ENb_EQ is applied to perform first amplification A1 of the difference in level between the sensing node SDL and the reference node VREF, and a second signal EN_AMP is applied to perform second amplification (i.e., accelerated amplification) of the amplified difference in level between the sensing node SDL and the reference node VREF.

Figure 23:
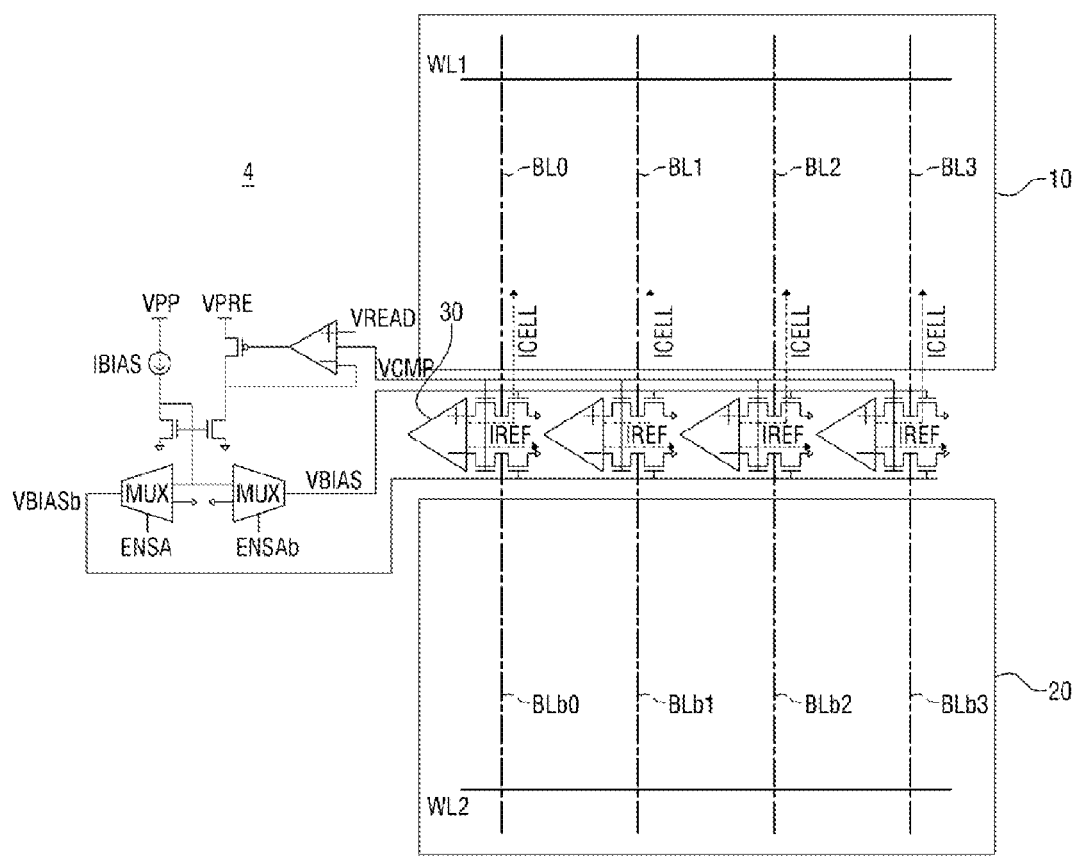
FIG. 23 is a block diagram for explaining a nonvolatile memory device according to still another embodiment of the present inventive concept.

FIG. 23 is a block diagram explaining a nonvolatile memory device according to still another embodiment of the present inventive concept. For convenience in explanation, explanation of the portions that are substantially the same as those of the nonvolatile memory device according to an embodiment of the present inventive concept as previously described above will be omitted.

Referring to FIG. 23, a nonvolatile memory device 4 according to still another embodiment of the present inventive concept includes a first memory cell array 10, a second memory cell array 20, a plurality of bit lines BL0 to BL3, a plurality of complementary bit lines BLb0 to BLb3, a first word line WL1, a second word line WL2, and a sense amplifier 30.

Each of the first and second memory cell arrays 10 and 20 includes a plurality of resistive memory cells. The resistive memory cells are substantially the same as those as described above.

The plurality of bit lines BL0 to BL3 are connected to the resistive memory cells included in the first memory cell array 10, and the plurality of complementary bit lines BLb0 to BLb3 are connected to the resistive memory cells included in the second memory cell array 20.

The first word line WL1 is connected to the plurality of bit lines BL0 to BL3, and the second word line WL2 is connected to the plurality of complementary bit lines BLb0 to BLb3.

The sense amplifier 30 is connected to one bit line BL0 and one complementary bit line BLb0, and senses the resistive memory cells included in the first memory cell array 10. In the same manner as described above, if the first word line WL1 is enabled, the second word line WL2 is disabled, and thus the resistive memory cells included in the first memory cell array can be sensed at the same time.

Although not illustrated in detail in FIG. 23, the nonvolatile memory device 4 may include a precharge voltage supplying unit that supplies precharge voltages to the resistive memory cells included in the first memory cell array 10. The precharge voltage supplying unit may include a first sub-precharge voltage supplying unit that supplies the first precharge voltage and a second sub-precharge voltage supplying unit that supplies the second precharge voltage. Even in this case, the time required to supply the second precharge voltage may be longer than the time required to supply the first precharge voltage in the same manner as described above.

Hereinafter, a method for sensing a nonvolatile memory device according to embodiments of the present inventive concept will be described.

Figure 24:
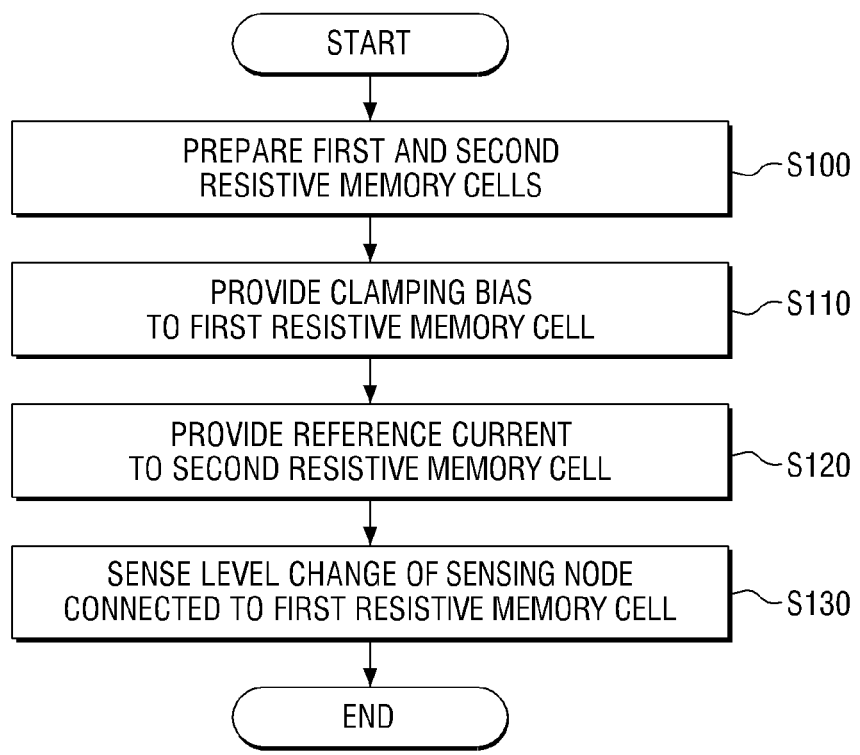
FIG. 24 is a flowchart sequentially illustrating a method for sensing a nonvolatile memory device according to an embodiment of the present inventive concept.

FIG. 24 is a flowchart sequentially illustrating a method for sensing a nonvolatile memory device according to an embodiment of the present inventive concept.

Referring to FIG. 24, according to a method for sensing a nonvolatile memory device according to an embodiment of the present inventive concept, a first resistive memory cell 100 connected to a first word line WL1 and a second resistive memory cell 110 connected to a second word line WL2 that is different from the first word line WL1 are prepared (S100).

The first resistive memory cell 100 refers to a resistive memory cell selected to be read from among a plurality of resistive memory cells in a memory cell array, and the second resistive memory cell 110 refers to a resistive memory cell that is selected to supply reference current IREF among the plurality of resistive memory cells in the memory cell array.

The first resistive memory cell 100 may be connected to a first bit line BL, and the second resistive memory cell 110 may be connected to a second bit line BLb. The first bit line BL and the second bit line BLb mean different bit lines. In particular, the first bit line BL and the second bit line BLb may be in a complementary relationship.

Then, a clamping bias VCMP1 is provided (S110) to the first resistive memory cell 100. That is, the level of the first bit line BL that is connected to the first resistive memory cell 100 is clamped to an appropriate readable range.

Then, the reference current IREF is provided (S120) to the second resistive memory cell 110. That is, the reference current IREF is supplied to the second bit line BLb that is connected to the second resistive memory cell 110. A fixed reference voltage VREF can be generated by supplying fixed reference current IREF to the second resistive memory cell 110.

Then, the level change of a sensing node SN that is connected to the first resistive memory cell 100 is sensed (S130). The sensing node SN is connected to the first resistive memory cell 100 and serves to sense the first resistive memory cell 100. Specifically, the sense amplifier 300 compares the level of the sensing node SN with a reference level to output the result of the comparison. The sense amplifier 300 may be a current sense amplifier or a voltage sense amplifier.

However, in the case where the first word line WL1 to which the first resistive memory cell 100 is connected is enabled, the second word line WL2 to which the second resistive memory cell 110 is connected is disabled, and the sensing operation is performed.

Figure 25:
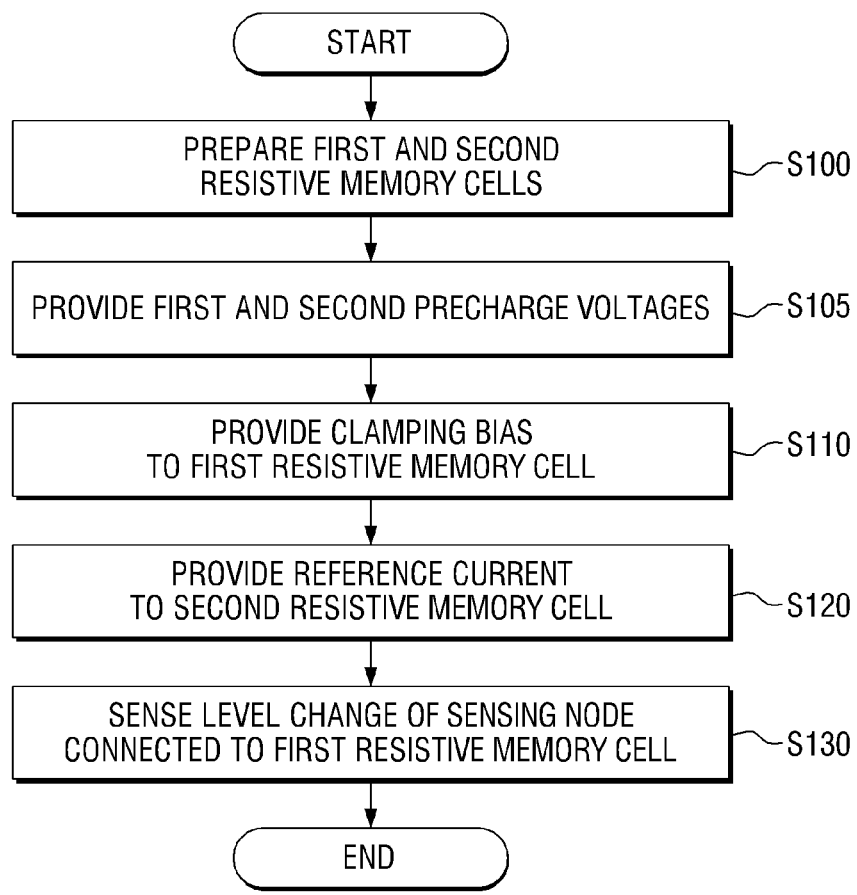
FIG. 25 is a flowchart sequentially illustrating a method for sensing a nonvolatile memory device according to another embodiment of the present inventive concept.

FIG. 25 is a flowchart sequentially illustrating a method for sensing a nonvolatile memory device according to another embodiment of the present inventive concept. For convenience in explanation, explanation of the portions that are substantially the same as those of the method for sensing a nonvolatile memory device according to an embodiment of the present inventive concept as described above will be omitted.

Referring to FIG. 25, a method for sensing a nonvolatile memory device according to another embodiment of the present inventive concept further includes preparing (S100) a first resistive memory cell 100 connected to a first word line WL1 and a second resistive memory cell 110 connected to a second word line WL 2 that is different from the first word line WL and providing (S105) a first precharge voltage VPRE_1 and a second precharge voltage VPRE2 to the first resistive memory cell 100.

Specifically, time required to supply the second precharge voltage VPRE_2 to the first resistive memory cell 100 is longer than time required to supply the first precharge voltage VPRE_1 to the first resistive memory cell 100.

Then, a clamping bias VCMP1 is provided (S110) to the first resistive memory cell 100, the reference current IREF is supplied (S120) to the second resistive memory cell 110, and the level change of a sensing node SN that is connected to the first resistive memory cell 100 is sensed (S130).

Figure 26:
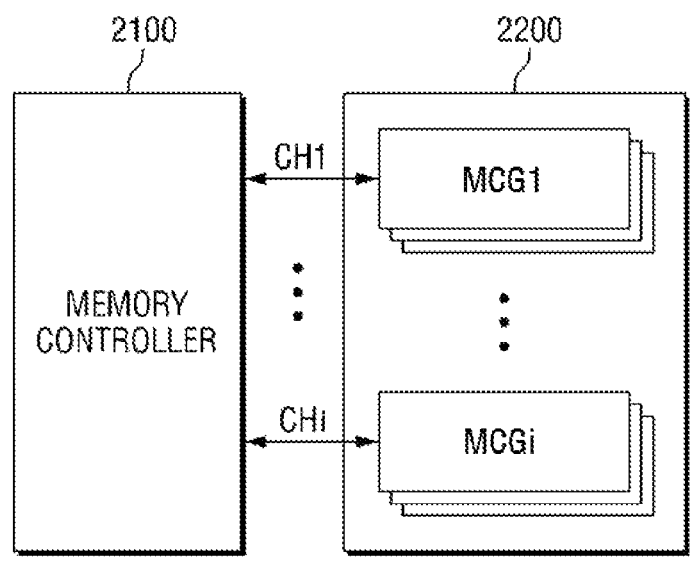
FIG. 26 is a block diagram for explaining an application example of a memory system including a nonvolatile memory device according to the present inventive concept.

FIG. 26 is a block diagram explaining an application example of a memory system including a nonvolatile memory device according to the present inventive concept.

Referring to FIG. 26, an application example 2000 of a memory system includes a memory controller 2100 and a memory device 2200.

The memory device 2200 may be configured to include a plurality of memory chips. The plurality of memory chips may be divided into a plurality of groups. Each of the plurality of groups of memory chips can interface with the memory controller 2100 through one common channel. For example, each of the plurality of groups MCG1 to MCGi of memory chips may interface with the memory controller 2100 through first to i-th channels CH1 to CHi.

In the application example 2000 of a memory system of FIG. 26, the plurality of memory chips may be configured to be substantially the same as the nonvolatile memory devices 1 to 4 as described above. The plurality of memory chips may perform a first program operation of a main program operation using a plurality of page data backed up in a page buffer.

FIG. 26 illustrates that the plurality of memory chips are connected to one channel. However, modification may be made so that one memory chip is connected to one channel.

The memory system 2000 as described above with reference to FIG. 26 may be provided as one of various constituent elements of electronic devices, such as a computer, a UMPC (Ultra Mobile PC), a work station, a net-book, a PDA (Personal Digital Assistants), a portable computer, a web tablet, a wireless phone, a mobile phone, a smart phone, an e-book, a PMP (Portable Multimedia Player), a portable game machine, a navigation device, a black box, a digital camera, a 3-dimensional television receiver, a digital audio recorder, a digital audio player, a digital picture recorder, a digital picture player, a digital video recorder, a digital video player, a device that can transmit and receive information in a wireless environment, one of various electronic devices constituting a home network, one of various electronic devices constituting a computer network, one of various electronic devices constituting a telematics network, an RFID device, and one of various constituent elements constituting a computing system for example.

Figure 27:
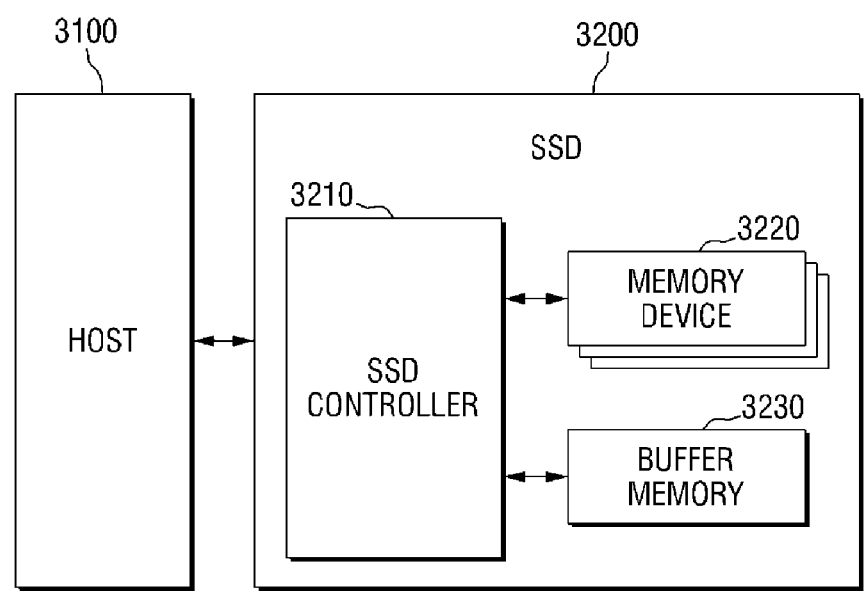
FIG. 27 is a block diagram for explaining a user system including a solid state drive.

FIG. 27 is a block diagram explaining a user system including a solid state drive.

Referring to FIG. 27, a user system 3000 includes a host 3100 and a solid state drive (SSD) 3200.

The solid state drive 3200 includes a SSD controller 3210, a memory device 3220, and a buffer memory 3230.

The SSD controller 3210 may be configured to interface with the host 3100. The SSD controller 3210 may access the memory device 3220 in response to a request from the host 3100. The SSD controller 3210 may transfer data that is received from the host 3100 to the buffer memory 3230.

The memory device 3220 may be provided as a storage medium of the solid state drive 3200. The memory device 3220 may be configured to include a plurality of memory chips. The plurality of memory chips may be configured to be substantially the same as the nonvolatile memory devices 1 to 4 as described above. The plurality of memory chips may perform a first program operation of a main program operation using a plurality of page data backed up in a page buffer.

The buffer memory 3230 may temporarily store the data transferred from the SSD controller 3210. During the program operation of the memory device 3220, the buffer memory 3230 may transfer the temporarily stored data to the memory device 3220.

FIG. 27 illustrates that the buffer memory 3230 is positioned outside the SSD controller 3210, but embodiments are not limited thereto. The buffer memory 3230 may be provided as an internal constituent element of the SSD controller 3210 for example.

Figure 28:
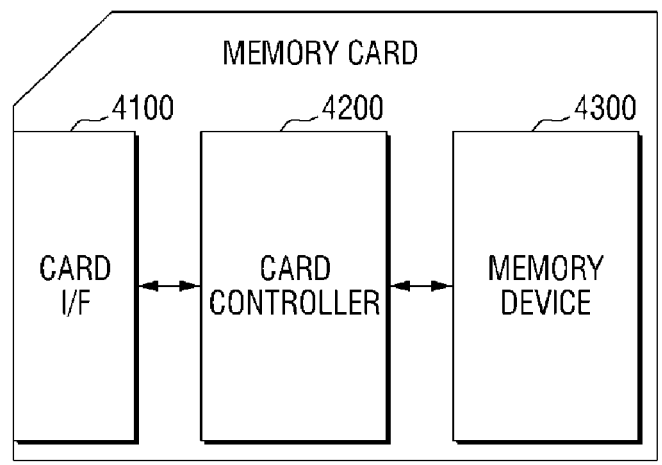
FIG. 28 is a block diagram for explaining a memory card including a nonvolatile memory device.

FIG. 28 is a block diagram for explaining a memory card including a nonvolatile memory device.

Referring to FIG. 28, a memory card 4000 includes a card interface 4100, a card controller 4200, and a memory device 4300.

The card interface may be composed of a plurality of pins to interface with the host. The pins include command pins, data pins, clock pins, and power pins, but are not limited thereto. The number of pins may be variously changed in accordance with the kind of memory card 4000.

The card controller 4200 may be configured to write data in the memory device 4300 or to read data from the memory device 4300 in response to a request from the host.

The memory device 4300 may be configured to be substantially the same as the nonvolatile memory devices 1 to 4 as described above. The memory device 4300 may perform a first program operation of a main program operation using a plurality of page data backed up in a page buffer.

The memory card 4000 may be one of various memory cards, such as a PC card (PCMCIA (Personal Computer Memory Card International Association)), a compact flash (CF) card, a smart media card (SM or SMC), a memory stick, a multimedia card (MMC, RS-MMC, or MMCmicro), a SD card (SD, miniSD, microSD, or SDHC), and/or a universal flash storage device (UFS) for example.

Figure 29:
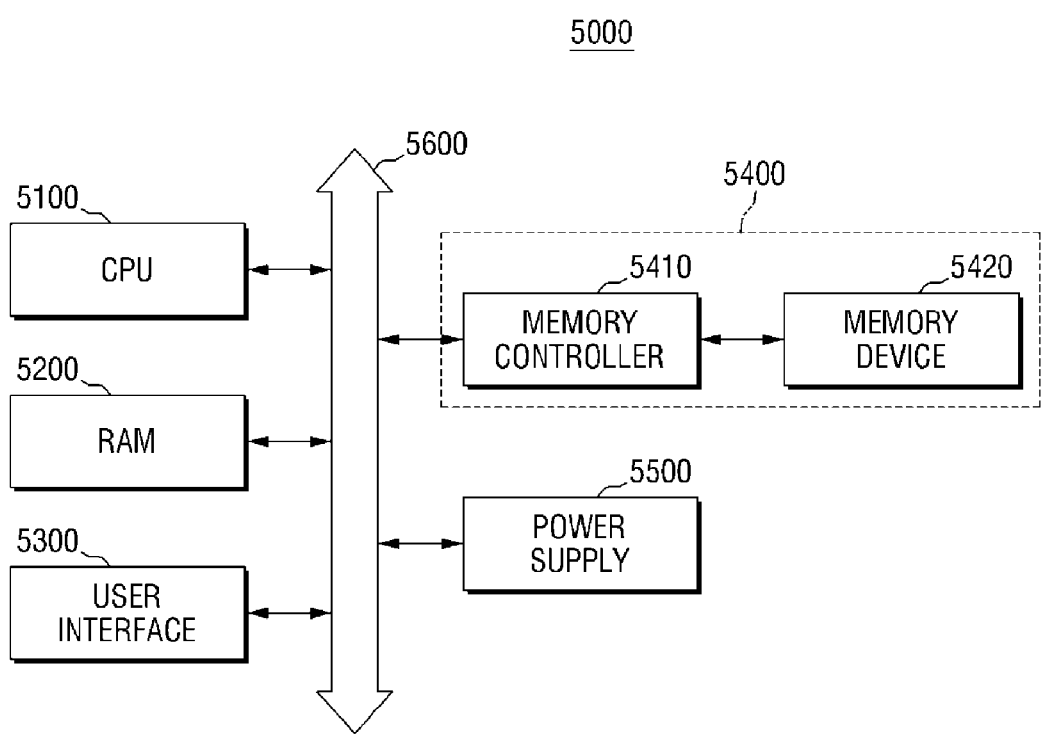
FIG. 29 is a block diagram for explaining a computer system including a nonvolatile memory device.

FIG. 29 is a block diagram explaining a computing system that includes a nonvolatile memory device.

Referring to FIG. 29, a computing system 5000 includes a central processing unit (CPU) 5100, a RAM 5200, a user interface 5300, a memory system 5400, and a power supply 5500.

The memory system 5400, which includes a memory controller 5410 and a memory device 5420, may be connected to the central processing unit 5100, the RAM 5200, the user interface 5300, and the power supply 5500 through a system bus 5600.

The memory system 5400 may be configured to be substantially the same as the application example 2000 of the memory system as described above with reference to FIG. 23. Data provided through the user interface 5300 or processed by the central processing unit 5100 may be stored in the memory system 5400.

FIG. 29 illustrates that the memory device 5420 is connected to the system bus 5600 through the memory controller 5410. However, the memory device 5400 may be configured to be directly connected to the system bus 5600.

The method explained in relation to the embodiments of the present inventive concept or steps of an algorithm may be directly implemented by a hardware module, a software module, which may be executed by a processor, or a combination thereof. The software module may reside in a RAM memory, a flash memory, a ROM memory, an EPROM memory, an EEPROM memory, a register, a hard disk, a detachable disk, a CD-ROM, or computer-readable recording media well known in the technical field to which the present inventive concept pertains. An exemplary recording medium may be connected to a processor, and the processor may read information from the recording medium or write information in the recording medium. As another method, the recording medium may be integrally formed with the processor. The processor and the recording medium may reside in an application-specific integrated circuit (ASIC). The ASIC may reside in a user terminal. As another method, the processor and the recording medium may reside as individual constituent elements in the user terminal.

Although preferred embodiments of the present inventive concept have been described for illustrative purposes, those skilled in the art will appreciate that various modifications, additions, and substitutions are possible without departing from the scope and spirit of the inventive concept as disclosed in the accompanying claims.

What is claimed is:

1. A nonvolatile memory device comprising:
 a first resistive memory cell connected to a first word line;
 a second resistive memory cell connected to a second word line that is different from the first word line;
 a clamping unit connected between a sensing node and the first resistive memory cell and configured to provide a clamping bias to the first resistive memory cell;
 a reference current supplying unit connected to the second resistive memory cell and configured to supply a reference current to the second resistive memory cell;
 a sense amplifier connected to the sensing node, the sense amplifier being configured to sense a level change of the sensing node;
 a controller configured to perform a sensing operation such that when the first word line is enabled, the second word line is disabled; and
 a precharge voltage supplying unit configured to supply a precharge voltage to the first resistive memory cell,
 wherein the precharge voltage comprises a first precharge voltage and a second precharge voltage, and wherein a time required to provide the second precharge voltage to the first resistive memory cell is longer than a time required to provide the first precharge voltage to the first resistive memory cell.

2. The nonvolatile memory device of claim 1, wherein the first resistive memory cell is connected to a first bit line, and the second resistive memory cell is connected to a second bit line that is different from the first bit line.

3. The nonvolatile memory device of claim 2, wherein the first bit line and the second bit line are in a complementary relationship.

4. The nonvolatile memory device of claim 1, wherein the precharge voltage supplying unit is configured to supply the precharge voltage to the first resistive memory cell a plurality of times.

5. The nonvolatile memory device of claim 1, wherein the precharge voltage supplying unit comprises a first sub-precharge voltage supplying unit configured to provide the first precharge voltage to the first resistive memory cell and a second sub-precharge voltage supplying unit configured to provide the second precharge voltage to the first resistive memory cell.

6. The nonvolatile memory device of claim 1, wherein the reference current supplying unit comprises a current mirror circuit.

7. A nonvolatile memory device comprising:
a first resistive memory cell connected to a first bit line;
a second resistive memory cell connected to a second bit line that is complementary to the first bit line;
a sensing node connected to the first resistive memory cell;
a reference node connected to the second resistive memory cell;
a first clamping unit connected to the bit line, and configured to provide a first clamping bias to the first resistive memory cell;
a reference current supplying unit connected to the reference node and the second resistive memory cell, and configured to supply a reference current;
a sense amplifier connected to the sensing node and the reference node, and configured to compare a sensing level of the sensing node with a reference level of the reference node determined according to operation of the reference current supplying unit; and
a precharge voltage supplying unit configured to supply a precharge voltage to the first resistive memory cell,
the precharge voltage supplying unit comprising a first sub-precharge voltage supplying unit configured to provide a first precharge voltage to the first resistive memory cell, and a second sub-precharge voltage supplying unit configured to provide a second precharge voltage to the first resistive memory cell, wherein a time required to provide the second precharge voltage to the first resistive memory cell is longer than a time required to provide the first precharge voltage to the first resistive memory cell.

8. The nonvolatile memory device of claim 7, wherein the sense amplifier comprises:
a first amplifying circuit configured to amplify a difference in level between the sensing node and the reference node; and
a second amplifying circuit configured to acceleratingly amplify the amplified difference in level between the sensing node and the reference node.

9. The nonvolatile memory device of claim 8, wherein the first amplifying circuit comprises a pair of PMOS transistors cross-coupled between the sensing node and the reference node, and the second amplifying circuit comprises a pair of NMOS transistors cross-coupled between the sensing node and the reference node, and the sense amplifier comprises a circuit that includes the pair of the PMOS transistors and the pair of the NMOS transistors, or a differential amplifier circuit that operates as a voltage comparator.

10. The nonvolatile memory device of claim 7, wherein the precharge voltage supplying unit is further configured to supply a precharge voltage to the second resistive memory cell, the precharge voltage supplying unit further comprising:
a third sub-precharge voltage supplying unit configured to provide a third precharge voltage to the second resistive memory cell; and
a fourth sub-precharge voltage supplying unit configured to provide a fourth precharge voltage to the second resistive memory cell.

11. A method of sensing a nonvolatile memory device, comprising:
connecting a first resistive memory cell to a first word line;
connecting a second resistive memory cell to a second word line that is different from the first word line;
connecting a clamping unit between a sensing node and the first resistive memory cell to provide a clamping bias to the first resistive memory cell;
connecting a reference current supplying unit to the second resistive memory cell to supply a reference current to the second resistive memory cell;
connecting a sense amplifier to the sensing node to sense a level change of the sensing node,
such that when the first word line is enabled, the second word line is disabled; and
supplying a precharge voltage to the first resistive memory cell,
wherein the precharge voltage comprises a first precharge voltage and a second precharge voltage, and wherein a time required to provide the second precharge voltage to the first resistive memory cell is longer than a time required to provide the first precharge voltage to the first resistive memory cell.

12. The method of claim 11, further comprising:
connecting the first resistive memory cell to a first bit line; and
connecting the second resistive memory cell to a second bit line that is different from the first bit line.

13. The method of claim 12, wherein the first bit line and the second bit line are in a complementary relationship.

14. The method of claim 11, wherein said supplying the precharge voltage comprises supplying the precharge voltage from the precharge voltage supplying unit to the first resistive memory cell a plurality of times.

* * * * *